(12) United States Patent
Yasukawa

(10) Patent No.: US 7,045,398 B2
(45) Date of Patent: May 16, 2006

(54) MANUFACTURING METHOD FOR ELECTRO-OPTICAL DEVICE, ELECTRO-OPTICAL DEVICE, MANUFACTURING METHOD FOR SEMICONDUCTOR DEVICE, SEMICONDUCTOR DEVICE, PROJECTION-TYPE DISPLAY APPARATUS, AND ELECTRONIC APPARATUS

(75) Inventor: Masahiro Yasukawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/390,684

(22) Filed: Mar. 19, 2003

(65) Prior Publication Data

US 2003/0232459 A1 Dec. 18, 2003

(30) Foreign Application Priority Data

Mar. 28, 2002 (JP) .............................. 2002-091626
Feb. 3, 2003 (JP) .............................. 2003-025871

(51) Int. Cl.
*H01L 21/00* (2006.01)
(52) U.S. Cl. ..................................... 438/149; 438/153
(58) Field of Classification Search ........ 438/149–167, 438/275; 257/E29.151, E29.005, E29.004
See application file for complete search history.

(56) References Cited

U.S. PATENT DOCUMENTS

| 4,753,896 A | | 6/1988 | Matloubian |
| 5,627,084 A | * | 5/1997 | Yamazaki et al. .......... 438/166 |
| 5,648,274 A | * | 7/1997 | Chandler .................... 436/514 |
| 5,851,918 A | * | 12/1998 | Song et al. .................. 438/627 |
| 6,025,629 A | | 2/2000 | Ipposhi et al. |
| 6,222,234 B1 | | 4/2001 | Imai |
| 6,337,232 B1 | | 1/2002 | Kusumoto et al. |
| 6,653,656 B1 | * | 11/2003 | Iwamatsu et al. ............. 257/59 |

FOREIGN PATENT DOCUMENTS

| JP | 04192472 A | * | 7/1992 |
| JP | 04-279604 | | 10/1992 |
| JP | A-5-218434 | | 8/1993 |
| JP | A 05-313195 | | 11/1993 |
| JP | A-9-135030 | | 5/1997 |
| JP | A-9-260679 | | 10/1997 |
| JP | A-11-74531 | | 3/1999 |
| JP | A 2001-125135 | | 5/2001 |
| JP | 2001313396 A | * | 11/2001 |
| JP | A 2001-313396 | | 11/2001 |
| KR | 1999-0083271 | | 11/1999 |

* cited by examiner

Primary Examiner—Brook Kebede
(74) Attorney, Agent, or Firm—Oliff & Berridge, PLC

(57) ABSTRACT

To provide a manufacturing method for an electro-optical device and semiconductor device which improve the shape of semiconductor layers in electro-optical devices and semiconductor device having semiconductor layers with different thickness, enabling manufacturing with good yield. The manufacturing method includes a patterning process to pattern a mono-crystalline silicone layer (semiconductor layer) formed on a supporting substrate with an insulating film introduced therebetween into a predetermined two-dimensional shape and dividing the semiconductor layer into a plurality of semiconductor regions, and a thin-layer formation process to perform thin-layer formation to form the semiconductor layer of a first semiconductor region, of the semiconductor regions formed by the patterning process, to have a predetermined semiconductor layer thickness.

11 Claims, 14 Drawing Sheets

FIG. 10
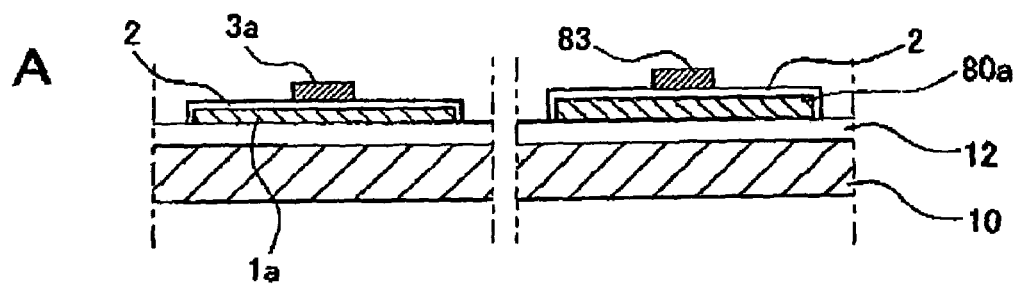
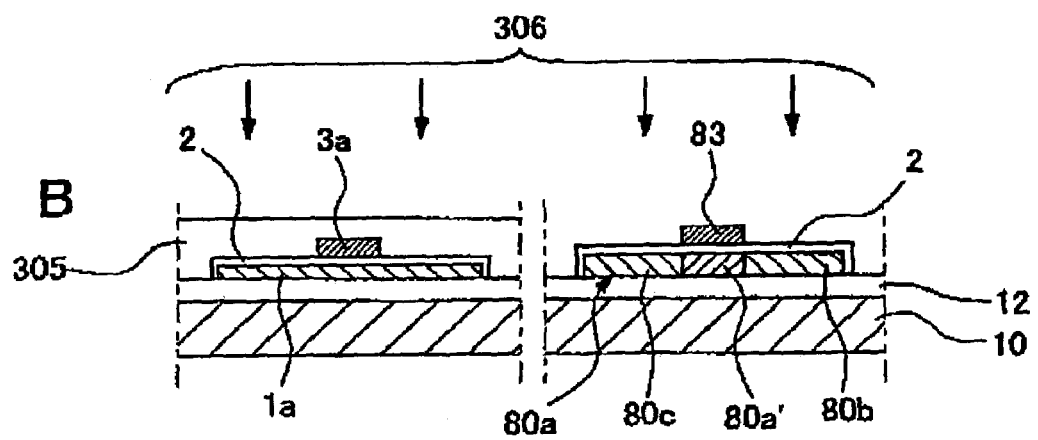
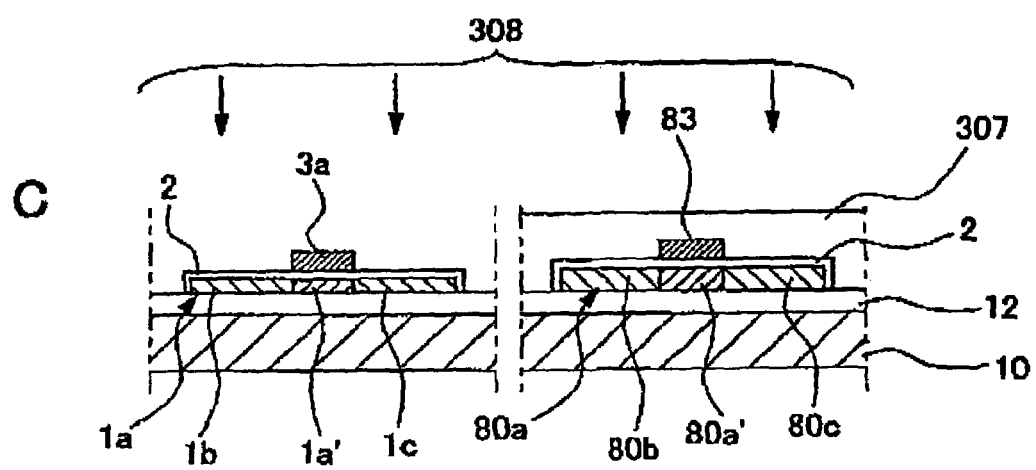

FIG. 12
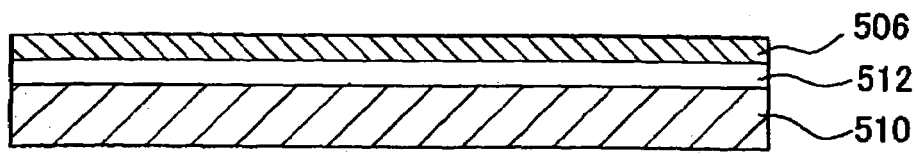
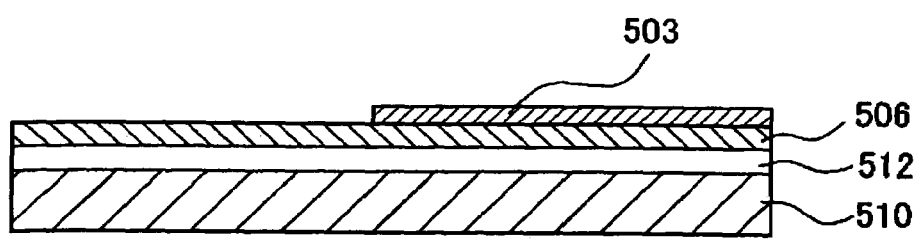
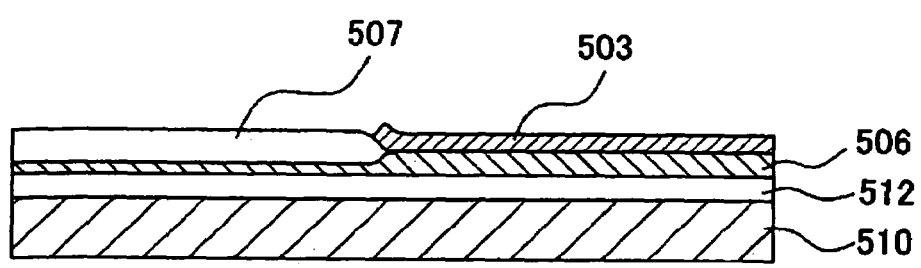
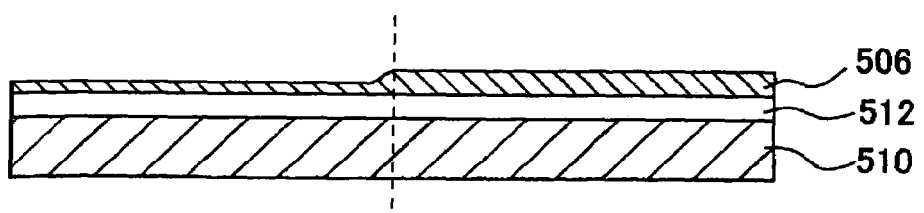
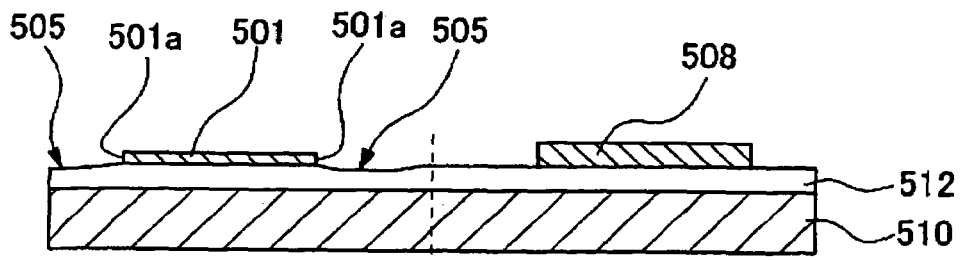
Related Art

FIG. 14
A
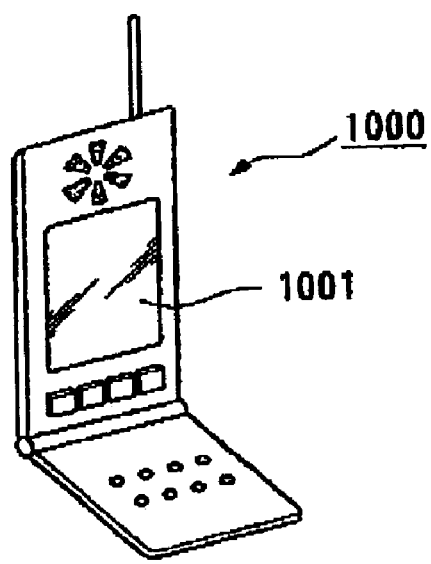
B
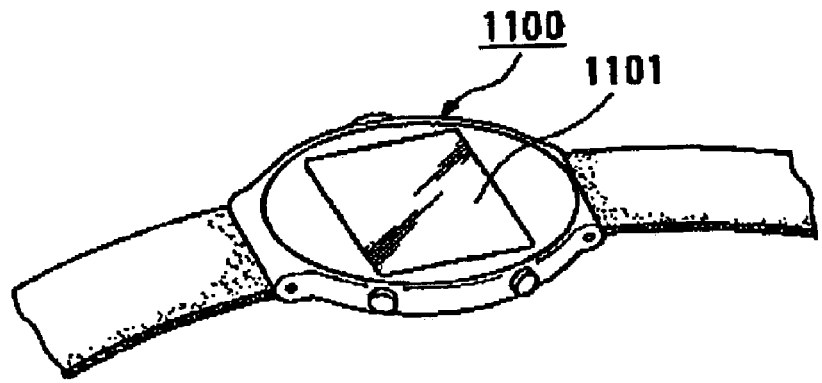
C
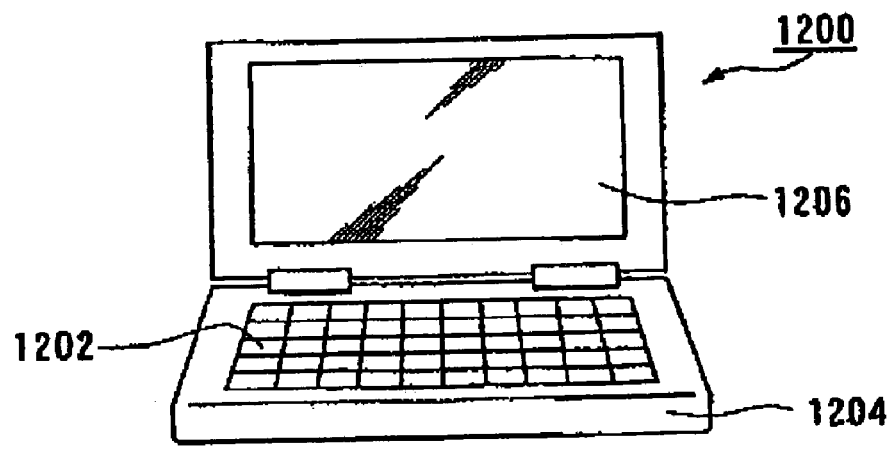

US 7,045,398 B2

MANUFACTURING METHOD FOR ELECTRO-OPTICAL DEVICE, ELECTRO-OPTICAL DEVICE, MANUFACTURING METHOD FOR SEMICONDUCTOR DEVICE, SEMICONDUCTOR DEVICE, PROJECTION-TYPE DISPLAY APPARATUS, AND ELECTRONIC APPARATUS

BACKGROUND OF THE INVENTION

1. Field of Invention

The present invention relates to a manufacturing method for electro-optical devices and semiconductor devices, and to an electro-optical device, semiconductor device, projection-type display device, and electronic device, to which the Silicon On Insulator technique (which will be abbreviated as "SOI" hereafter) is applied, and particularly relates to manufacturing methods to manufacture electro-optical devices and semiconductor devices having excellent reliability with a high yield, and an electro-optical device and semiconductor device with excellent reliability.

2. Description of Related Art

Conventionally, the SOI technique, wherein a semiconductor layer made up of a mono-crystalline silicon layer is formed on a insulator substrate, and semiconductor devices such as transistors and so forth are formed on the semiconductor layer, has the advantage of increased speeds, low power consumption, high integration, and the like, with regard to devices, and is a technique which has been also applied to a support substrate or the like on which a thin film transistor array (which will be referred to as "TFT" hereafter) is formed in electro-optical devices (e.g., liquid crystal devices). For manufacturing electro- optical devices employing the SOI technique as described above, a semiconductor substrate having a mono-crystalline semiconductor layer made up of mono-crystalline silicon or the like is adhered onto the support substrate. The thin film mono-crystalline semiconductor layer is formed by a method of polishing or the like, and the thin film mono-crystalline semiconductor layer is formed into transistor devices to drive liquid crystals, or the like.

Also, a technique wherein semiconductor regions with different layer thickness exist together on an SOI substrate has been applied to semiconductor integrated circuit device. For example, Japanese Unexamined Patent Application Publication No. 11-74531 as described below discloses that multiple silicon layers with thickness different one from another are formed on an embedded oxide layer, and partial-depletion-type CMOS devices are formed on a thick silicon layer of the above silicon layers, and complete- depletion-type CMOS devices are formed on a thin silicon layer thereof, thereby enabling both of low leakage current and high-speed operation to be realized.

In particular, recently, related art liquid crystal devices have been manufactured wherein transistor devices making up a peripheral circuit or the like are formed on a substrate along with transistor devices to drive liquid crystals. With the liquid crystal devices as described above, a semiconductor layer, which is to be formed into transistor devices to drive liquid crystals is formed with a thickness less than that of a semiconductor layer, which is to be formed into transistor devices making up a peripheral circuit (see Japanese Unexamined Patent Application Publication No. 11-74531, for example). With the liquid crystal devices as described above, a photo-leakage current can be reduced in the transistor devices to drive liquid crystals, and in the peripheral circuit, high-speed driving of transistor devices can be realized, and off-leakage current can be reduced.

FIGS. 12A–12E are cross-sectional process diagrams which illustrate the related art manufacturing process for semiconductor devices or electro-optical devices having semiconductor layers with different thickness as described above. With the manufacture method as shown in the drawing, first of all, an SOI substrate is prepared wherein a mono- crystalline silicon layer 506 is provided on a support substrate 510 with a silicon-oxide layer 512 introduced therebetween as shown in FIG. 12A. In the manufacturing of semiconductor devices, a silicon substrate is used for the support substrate 510. In the manufacturing of electro-optical devices, a quartz substrate is used for the support substrate 510. Subsequently, as shown in FIG. 12B, a silicon-nitride layer 503 is formed at a predetermined region on the mono-crystalline silicon layer 506 on the SOI substrate.

Next, as shown in FIG. 12C, the mono-crystalline silicon layer 506 is oxidized from the surface side by thermal-oxidation. At this time, the mono-crystalline silicon layer 506 on the region on which the silicon-nitride layer 503 is formed is not oxidized. Conversely, an oxidized layer 507 is formed on the surface of the mono-crystalline silicon layer 506 on the region on which the silicon-nitride layer 503 is not formed.

Next, the silicon-nitride layer 503 and the oxidized layer 507 are removed by etching, thereby obtaining the SOI substrate with the thickness of the mono-crystalline silicon layer being partially reduced as shown in FIG. 12D.

Subsequently, the mono-crystalline silicon layer 506 of the SOI substrate shown in FIG. 12D is subjected to patterning so as to obtain an electro-optical device having mono-crystalline silicon layers (semiconductor layers) with different layer thickness as shown in FIG. 12E. As shown in FIG. 12E, a first semiconductor layer 501 with thin layer thickness, and a second semiconductor layer 508 with a layer thickness greater than that of the first semiconductor layer, are formed on the electro-optical device, and transistor devices to drive pixels are formed on the first semiconductor layer 501 of the above-described semiconductor layers, and transistor devices for a peripheral circuit are formed on the second semiconductor layer 508 thereof, thereby providing an electro-optical device wherein optical leakage is reduced on the pixel area, and a high-speed driving circuit is formed on the perimeter region, and accordingly a high-speed crystal device with excellent reliability can be configured.

SUMMARY OF THE INVENTION

However, with the electro-optical device manufactured with the above- described related art manufacturing method, as shown in FIG. 12E, recessed portions 505 wherein the silicon-oxide layer 512 has been subjected to over-etching at both sides of the first semiconductor layer 501 are formed due to performing etching the mono-crystalline silicon layer 506 with thickness partially being different in the processes shown in FIG. 12D and FIG. 12E. In the event of enhancing the etching selection ratio of mono-crystalline silicon to silicon-oxide to prevent the formation of the recessed portions 505, side face portions 501a of the first semiconductor layer 501 are subjected to over-etching, so the side face portions 501a are formed in a recessed shape, and consequently, the outer edge of the first semiconductor layer 501 has an acute angle. In a case that the outer edge of the first semiconductor layer 501 has an acute angle, in the event that the first semiconductor layer is subjected to gate-oxidation so as to form transistor devices, the layer thickness of the gate oxidized layer around the outer edge of the first semiconductor layer 501 decreases, and accordingly, the off-leakage current increases due to parasitic MOS phenomenon. Also, with the electro-optical devices manufactured with the above-described related art manufacturing method, a problem is known that when the mono-crystalline silicon layer 506 is oxidized from the surface in the process shown in FIG. 12B, defects such as slips or the like occur in the mono-crystalline silicon layer 506 due to the difference in thermal expansion of the mono-crystalline silicon layer 506 and the silicon-oxide layer 512.

As described above, with the related art manufacturing methods, there is the difficulty in that with electro-optical devices or semiconductor devices wherein multiple semiconductor layers with different thickness exist together, each semiconductor layer cannot be formed into accurate shapes, leading to the problem of the yield being reduced due to malfunction of transistor devices owing to the inaccurate form of the semiconductor layers.

The present invention has been made to address the above problems, and accordingly to enhance the shape of semiconductor layers in electro-optical devices having semiconductor layers with different thickness, and provide a method to manufacture highly-reliable electro-optical devices with good yield.

Also, the present invention provides an electro-optical display device having semiconductor layers with different thickness which allows highly-reliable semiconductor devices such as transistor devices to be formed on the semiconductor layers.

Also, the present invention enhances the shape of semiconductor layers in semiconductor layer devices having semiconductor layers with different thickness, and provide a method to manufacture highly-reliable semiconductor devices with good yield.

Also, the present invention provides a semiconductor device having semiconductor layers with different thickness which allows highly-reliable semiconductor devices such as transistor devices to be formed on the semiconductor layers.

Also, the present invention provides a highly-reliable projection-type display device and electronic apparatus having the above electro-optical device or semiconductor device.

To address the above problems, a manufacturing method according to the present invention to manufacture an electro-optical device including a substrate and a semiconductor layer formed on the substrate with an insulating film introduced therebetween, wherein the semiconductor layer is divided into two or more semiconductor regions with different layer thickness, includes: a patterning process to pattern the semiconductor layer according to a predetermined two-dimensional shape and dividing the semiconductor layer into a plurality of semiconductor regions; and a thin-layer formation process for thin-layer formation of one or more regions of the semiconductor regions formed by the patterning process into a predetermined semiconductor layer thickness.

For example, with the manufacturing method according to the present invention, a patterning process to divide the semiconductor region is performed, following which a thin-layer formation process is performed to form the semiconductor layer in each of the semiconductor regions into a predetermined semiconductor layer thickness. According to this manufacturing method, patterning is performed with the thickness of the semiconductor layer on the substrate in a uniform state, so the etching depth is uniform on the substrate, and over-etching of the insulating film, which has been a problem in conventional manufacturing methods, does not occur. Also, the semiconductor regions to be subjected to thin-layer formation are divided from the other semiconductor regions beforehand, so the form of the semiconductor layer can be readily controlled in each region, and also defects such as slipping can be prevented by suppressing thermal expansion of the volume of the mono-crystalline film due to thermal expansion difference, thereby forming the semiconductor layer in a more precise form. Thus, decrease in yield due to malfunctioning of the semiconductor device formed on the semiconductor layer can be prevented, enabling efficient manufacturing.

Next, with the manufacturing method according to the present invention, in the thin-layer formation process, an oxidized layer may be formed on the surface of the semiconductor layer by oxidizing the surface of the semiconductor layer of a semiconductor region regarding which thin-layer formation is to be performed, with the oxidized layer being subsequently removed, thereby performing thin-layer formation of the semiconductor layer.

With this method, the thickness of the semiconductor layer can be controlled by the oxidation conditions at the time of forming the oxidized layer, so thin-layer formation of the semiconductor layer can be readily performed in a uniform manner.

Next, with the manufacturing method according to the present invention, in the thin-layer formation process, a side-face passivation layer containing oxidation-resistant material may be formed on the side face portion of the semiconductor region regarding which thin-layer formation is to be performed, with an oxidized layer then being formed on the top face of the semiconductor layer by oxidizing the top face of the semiconductor layer, and subsequently the oxidized layer being removed, thereby performing thin-layer formation of the semiconductor layer.

In this method, following a side-face passivation layer being formed on the side face portion of the semiconductor layer, an oxidized layer is formed by oxidizing the top face of the semiconductor layer, and subsequently the oxidized layer is removed, thereby performing thin-layer formation of the semiconductor layer. According to this manufacturing method, a side-face passivation layer of an oxidation-resistant material is formed on the side face portion of the semiconductor layer, so there is no oxidation of the side face portion of the semiconductor layer, and accordingly the planar dimensions of the semiconductor layer is not reduced by the thin-layer formation process, so the shape of the semiconductor layer can be controlled in an easier and more precise manner.

Next, with the manufacturing method according to the present invention, in the thin-film formation process, an oxidized passivation layer the same layer as the side-face passivation layer containing oxidation-resistant material may be formed on semiconductor regions other than semiconductor regions to be subjected to thin-layer formation.

With this manufacturing method, the oxidized passivation layer formed on the semiconductor regions not subjected to thin-layer formation, and the side-face passivation layer formed on semiconductor regions to be subjected to thin-layer formation, can be formed with the same film-formation process, so the manufacturing process can be streamlined, while facilitating manufacturing and reducing manufacturing costs.

Next, with the manufacturing method according to the present invention, the side-face passivation layer may be removed at the same time as the oxidation layer.

With this manufacturing method, the same removal process can be used for the oxidation layer and the side-face passivation layer, so the manufacturing process can be streamlined.

Next, with the manufacturing method according to the present invention, the side-face passivation layer may be a layered structure including an oxidized film formed of an oxide of a material making up the semiconductor layer, and an oxidation-resistant film made up of oxidation-resistant material formed on the oxidized film.

With this manufacturing method as well, oxidation of the side face portion of the semiconductor layer in the oxidation process in the film formation process and the transistor formation process can be prevented, thus facilitating formation and dimensions control of the semiconductor layer and transistor devices.

Also, forming an oxidized layer by oxidizing a semiconductor layer having the oxidized film in the thin film formation process allows the shape at the surrounding edges of the semiconductor layer, following removing of the oxidized layer, to be made somewhat obtuse, since the thickness of the oxidized layer at the surrounding edges of the semiconductor layer is greater, due to the oxidized film provided on the side face portions acting thereupon. With a semiconductor layer with such a shape, in the event that a gate oxidized layer is formed at this semiconductor layer, the thickness of the gate oxidized layer does not become thin at the surrounding edges of the semiconductor layer, and thus occurrence of the parasitic MOS phenomenon at the surrounding edges of the semiconductor layer can be suppressed.

This side-face passivation layer may be removed in the thin-layer formation process, or an arrangement may be used wherein the side-face passivation layer is left. Leaving the side-face passivation layer keeps the side face of the semiconductor layer from being oxidized at the time of gate oxidation in the transistor formation process, so dimensions control of the transistor device can be facilitated.

Next, with the manufacturing method according to the present invention, the height of the side-face passivation layer, in the direction of the thickness of the semiconductor layer, may be formed to be approximately the same height as the layer thickness of the semiconductor layer to be subjected to thin-layer formation, following thin- layer formation.

With this method, only the portion of the semiconductor layer protruding beyond the side-face passivation layer can be removed following oxidation, so a semiconductor layer having a side-face passivation layer can be readily formed. In the event of forming a transistor device on such a semiconductor layer, only the top face of the semiconductor layer is oxidized to form the gate oxidized layer, so the gate oxidized layer at the edge portions of the semiconductor layer does not become thin, occurrence of the parasitic MOS phenomenon at the edge portions of the semiconductor layer at a lower portion of the gate electrode can be suppressed, and off-leakage current can be suppressed.

Next, with the manufacturing method according to the present invention, the material making up the semiconductor layer preferably is poly-silicone or mono-crystalline silicone. Forming the semiconductor layer of silicone, which has excellent crystal properties, allows an electro-optical device with switching devices capable of high-speed operations.

Next, with the manufacturing method according to the present invention, the oxidized film formed of an oxide of a material making up the semiconductor layer preferably is a silicon oxide film or a silicone oxynitride film. Using either of these oxidized films allows the shape at the surrounding edges of the semiconductor layer following removing of the oxidized layer to be made somewhat obtuse, since the thickness of the oxidized layer at the surrounding edges of the semiconductor layer is greater. With a semiconductor layer with such a shape, in the event that a gate oxidized layer is formed at this semiconductor layer, the thickness of the gate oxidized layer does not become thin at the surrounding edges of the semiconductor layer, so occurrence of the parasitic MOS phenomenon, at the surrounding edges of the semiconductor layer, can be suppressed.

Next, the electro-optical device according to the present invention is an electro-optical device, a semiconductor layer being formed on a substrate with an insulating film introduced therebetween; the semiconductor layer being divided into a plurality of semiconductor regions with different layer thickness; and a side-face passivation layer containing oxidation-resistant material being formed on the semiconductor layer side face of at least one of the semiconductor regions.

With this electro-optical device, a side-face passivation layer is formed on the side face of the semiconductor layer, thereby keeping the side face portion of the semiconductor layer from being oxidized at the time of forming a semiconductor device such as a transistor device or the like using he semiconductor layer. Accordingly, in the event that a gate oxidized layer is formed on the top face of the semiconductor layer for example, the gate oxidized layer is formed with a uniform thickness on only the top face of the semiconductor layer, and the side face of the semiconductor layer is protected by the side- face passivation layer. Accordingly, the parasitic MOS phenomenon due to the thickness of the gate oxidized layer, becoming partially thin, can be prevented from occurring, thereby yielding an electro-optical device wherein formation of semiconductor devices with excellent reliability can be formed.

Also, the height of the side-face passivation layer in the direction of the thickness of the semiconductor layer is preferably formed to be approximately the same height as the layer thickness of the semiconductor layer, or higher. This is because in the event that the side-face passivation layer is lower than the semiconductor layer, the gate oxidized layer formed in the semiconductor layer may become partially thin at the perimeter edges of the semiconductor layer.

Next, the electro-optical device according to the present invention may have a configuration wherein the side-face passivation layer includes an oxidized film formed of an oxide of a material making up the semiconductor layer, and an oxidation-resistant film formed on the oxidized film.

This configuration yields advantages the same as the above electro-optical device, as well.

Next, with the electro-optical device according to the present invention, of the plurality of semiconductor regions, one or a plurality of the semiconductor regions are contained in a pixel region in which are formed a plurality of scanning lines, a plurality of data lines intersecting the plurality of scanning lines, transistors provided in a manner corresponding with the scanning lines and data lines on the semiconductor layer, pixel electrodes provided corresponding to the transistors; and other semiconductor regions are contained in a perimeter region forming peripheral circuits having a plurality of transistors formed on the semiconductor layer.

That is, the electro-optical device according to this configuration is a electro- optical device wherein the thickness of the semiconductor layer differs between the pixel region, where transistor devices to drive pixels are formed, and the perimeter region where peripheral circuits are formed, including a side-face passivation layer at the side face portions of the semiconductor layer. According to such a configuration, transistor devices having capabilities suitable for each of the pixel region and perimeter region can be formed, as well as providing an electro-optical device with excellent reliability, capable of suppressing the parasitic MOS phenomenon due to the side-face passivation layer formed on the side faces of the semiconductor layer.

Next, the electro-optical device according to the present invention includes a facing substrate disposed facing the substrate upon which the pixel region and perimeter region have been formed, and liquid crystal held between the substrates and driven by the transistors. According to this configuration, a liquid crystal device with excellent reliability can be obtained.

Also, with the electro-optical device according to the present invention, the thickness of the semiconductor layer is thicker in the perimeter region than the pixel region.

The method to manufacture a semiconductor device according to the present invention includes a substrate and a semiconductor layer formed on the substrate with an insulating film introduced therebetween, wherein the semiconductor layer is divided into two or more semiconductor regions with different layer thickness, including: a patterning process to pattern the semiconductor layer according to a predetermined two-dimensional shape and dividing the semiconductor layer into a plurality of semiconductor regions; and a thin-layer formation process to form one or more thin-layer regions of the semiconductor regions formed by the patterning process into a predetermined semiconductor layer thickness; wherein, in the thin-layer formation process, a side-face passivation layer containing oxidation-resistant material is formed on the side face portion of the semiconductor layer on the semiconductor region regarding which thin-layer formation is to be performed, following which an oxidized layer is formed on the top face of the semiconductor layer by oxidizing the top face of the semiconductor layer, and subsequently the oxidized layer is removed, thereby performing thin-layer formation of the semiconductor layer.

With this manufacturing method, patterning is performed with the thickness of the semiconductor layer on the substrate in a uniform state, so the etching depth is uniform on the substrate, and over-etching of the insulating film, which has been a problem in related art manufacturing methods, does not occur. Also, the semiconductor regions to be subjected to thin-layer formation in the thin-layer formation process are divided from the other semiconductor regions beforehand, so the form of the semiconductor layer can be readily controlled in each region, and also defects such as slipping can be prevented by suppressing thermal expansion of the volume of the mono-crystalline film du to thermal expansion difference, thereby forming the semiconductor layer in a more precise form. Further, a side-face passivation layer containing oxidation-resistant material is formed on the side face portion of the semiconductor region, so the side face portion of the semiconductor layer is not oxidized, meaning that the planar dimensions of the semiconductor layer are not reduced by the thin-layer formation process, and control of the form of the semiconductor layer can be performed more readily and more precisely. Thus, with the method to manufacture a semiconductor device according to the present invention, decrease in yield due to malfunctioning of the semiconductor device formed on the semiconductor layer can be prevented, enabling efficient manufacturing.

With the method to manufacture a semiconductor device according to the present invention, in the thin-layer formation process, an oxidized passivation layer the same layer as the side-face passivation layer containing the oxidation-resistant material may be formed on semiconductor regions other than semiconductor regions to be subjected to thin-layer formation.

With this manufacturing method, the oxidized passivation layer formed on the semiconductor region not subjected to thin-layer formation and the side-face passivation layer formed on semiconductor regions to be subjected to thin-layer formation can be formed with the same film-formation process, so the manufacturing process can be streamlined, improving ease of manufacturing, and also reducing manufacturing costs.

With the method to manufacture a semiconductor device according to the present invention, the side-face passivation layer may be removed at the same time as the oxidation layer. With this manufacturing method, the same removal process can be used for the oxidation layer and the side-face passivation layer, so the manufacturing process can be streamlined.

With the method to manufacture a semiconductor device according to the present invention, the side-face passivation layer may be a layered structure including an oxidized film formed of an oxide of a material making up the semiconductor layer and an oxidation-resistant film made up of oxidation-resistant material formed on the oxidized film.

With this method as well, oxidation of the side face portion of the semiconductor layer in the oxidation process in the thin-film formation process and the transistor formation process can be prevented, thus facilitating formation and dimensions control of the semiconductor layer and transistor devices.

Also, forming an oxidized layer by oxidizing a semiconductor layer having the oxidized film in the thin-layer formation process allows the shape at the surrounding edges of the semiconductor layer following removing of the oxidized layer to be made somewhat obtuse, since the thickness of the oxidized layer at the surrounding edges of the semiconductor layer is greater, due to the oxidized film provided on the side face portions acting thereupon. With a semiconductor layer with such a shape, in the event that a gate oxidized layer is formed at this semiconductor layer, the thickness of the gate oxidized layer does not become thin at the surrounding edges of the semiconductor layer, and thus occurrence of the parasitic MOS phenomenon at the surrounding edges of the semiconductor layer can be suppressed.

This side-face passivation layer may be removed in the thin-layer formation process, or an arrangement may be used wherein the side-face passivation layer is left. Leaving the side-face passivation layer, keeps the side face of the semiconductor layer from being oxidized, at the time of gate oxidation in the transistor formation process, so dimensions control of the transistor device can be facilitated.

With the method to manufacture a semiconductor device according to the present invention, the height of the side-face passivation layer in the direction of the thickness of the semiconductor layer may be formed to be approximately the same height as the layer thickness of the semiconductor layer to be subjected to thin-layer formation following thin-layer formation.

With this method, only the portion of the semiconductor layer protruding beyond the side-face passivation layer can be removed following oxidation, so a semiconductor layer having a side-face passivation layer can be readily formed.

In the event of forming a transistor device on such a semiconductor layer, only the top face of the semiconductor layer is oxidized to form the gate oxidized layer, so the gate oxidized layer at the edge portions of the semiconductor layer do not become thin, occurrence of the parasitic MOS phenomenon at the edges of the semiconductor layer at a lower portion of the gate electrode can be suppressed, and off-leakage current can be suppressed.

With the method to manufacture a semiconductor device according to the present invention, preferably, the semiconductor layer is a mono-crystalline silicone layer, and wherein the oxidized film formed of an oxide of a material making up the semiconductor layer is a silicon oxide film or a silicone oxynitride film.

Using either of these oxidized films allows the shape at the surrounding edges of the semiconductor layer following removing of the oxidized layer to be made somewhat obtuse, since the thickness of the oxidized layer at the surrounding edges of the semiconductor layer is greater. With a semiconductor layer with such a shape, in the event that a gate oxidized layer is formed at this semiconductor layer, the thickness of the gate oxidized layer does not become thin at the surrounding edges of the semiconductor layer, so occurrence of the parasitic MOS phenomenon, at the surrounding edges of the semiconductor layer, can be suppressed.

The semiconductor device according to the present invention is a semiconductor device including a substrate and a semiconductor layer formed on the substrate with an insulating film introduced therebetween; the semiconductor layer being divided into a plurality of semiconductor regions with different layer thickness; and a side-face passivation layer containing oxidation-resistant material being formed on the semiconductor layer side face of at least one of the semiconductor regions.

With this semiconductor device thus configured, a side-face passivation layer is formed on the side face of the semiconductor layer, thereby keeping the side face portion of the semiconductor layer from being oxidized at the time of forming a device, such as a transistor device or the like, using the semiconductor layer. Accordingly, in the event that a gate oxidized layer is formed on the top face of the semiconductor layer for example, the gate oxidized layer is formed with a uniform thickness on only the top face of the semiconductor layer, and the side face of the semiconductor layer is protected by the side- face passivation layer. Accordingly, the parasitic MOS phenomenon due to the thickness of the gate oxidized layer becoming partially thin can be prevented from occurring, thereby yielding a semiconductor device capable of mounting semiconductor devices with excellent reliability.

Also, the height of the side-face passivation layer in the direction of the thickness of the semiconductor layer is preferably formed to be approximately the same height as the layer thickness of the semiconductor layer, or higher. This is because that in the event that the side-face passivation layer is lower than the semiconductor layer, the gate oxidized layer formed in the semiconductor layer may become partially thin at the perimeter edges of the semiconductor layer.

With the semiconductor device according to the present invention, the side- face passivation layer may include an oxidized film formed of an oxide of a material making up the semiconductor layer, and an oxidation-resistant film made up of oxidation-resistant material formed on the oxidized film. With this configuration as well, a semiconductor device capable of mounting devices with excellent reliability can be provided, as with the foregoing configurations.

With the semiconductor device according to the present invention, preferably, the semiconductor layer is a mono-crystalline silicone layer, and the oxidized film formed of an oxide of a material making up the semiconductor layer being a silicon oxide film or a silicone oxynitride film. With this configuration as well, a semiconductor device capable of mounting devices with excellent reliability can be provided, as with the foregoing configurations.

Next, the projection-type display device according to the present invention is a projection-type display device having one of the aforementioned electro-optical devices, and comprises: a light source; light modulating means made up of the electro-optical device for modulating light emitted from the light source; and projecting means for projecting light modulated by the light modulating means.

According to this configuration, a projection-type display device having excellent reliability can be provided, due to including the aforementioned electro-optical devices.

Next, the electronic apparatus according to the present invention includes one of the aforementioned electro-optical devices. This also includes one of the aforementioned semiconductor devices.

According to this configuration, an electronic apparatus having a display unit with excellent reliability, and an electronic apparatus having a semiconductor integrated circuit with excellent reliability, can be provided.

BRIEF DESCRIPTION OF THE DRAWINGS

FIGS. 10A–10C are cross-sectional procedure diagrams illustrating a formation method for a transistor device using the electro-optical device according to the present invention.

FIGS. 12A–12E are cross-sectional procedure diagrams illustrating a conventional electro-optical device manufacturing method.

FIGS. 14A–C are perspective configuration diagrams of electronic apparatuses according to the present invention.

DETAILED DESCRIPTION OF PREFERRED EMBODIMENTS

Description will now be made, regarding exemplary embodiments according to the present invention, with reference to the drawings.

Liquid Crystal Device

Description will be made below regarding a liquid crystal device which is an example of electro-optical devices according to the present invention with reference to the drawings.

Figure 1:
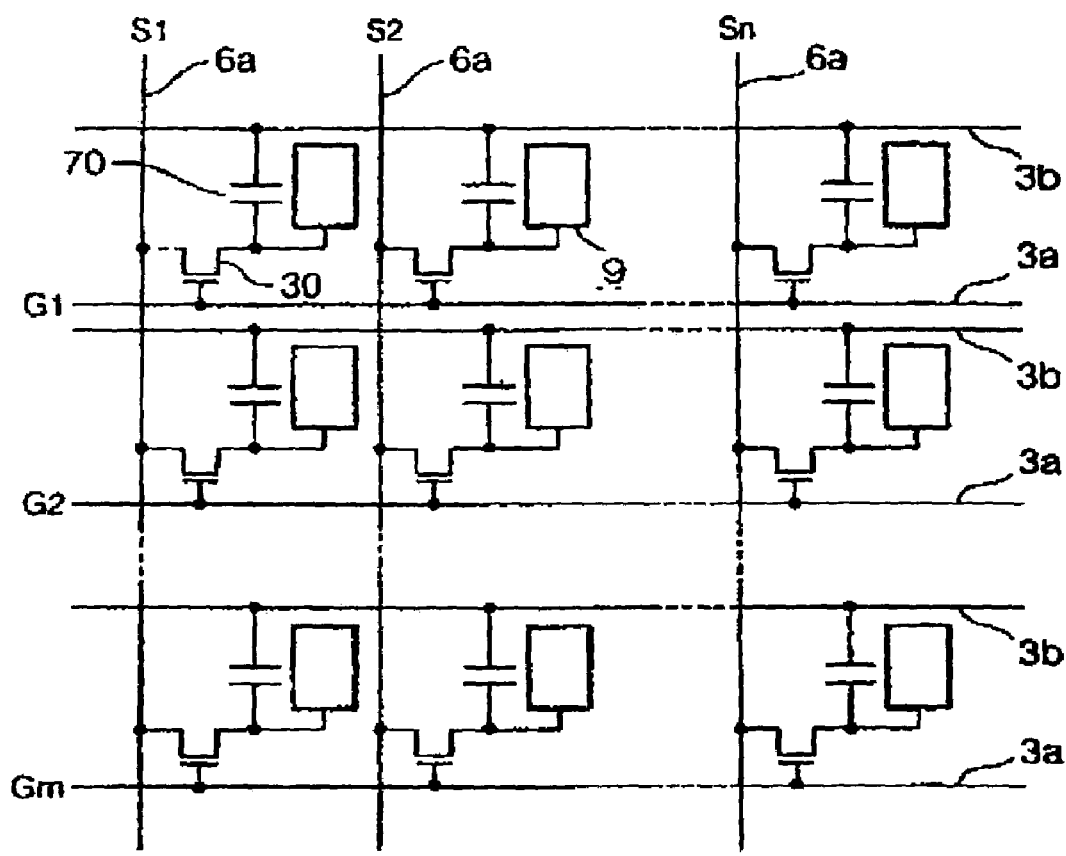
FIG. 1 is a schematic circuit diagram of a liquid crystal device which is an exemplary embodiment of the present invention.
Figure 2:
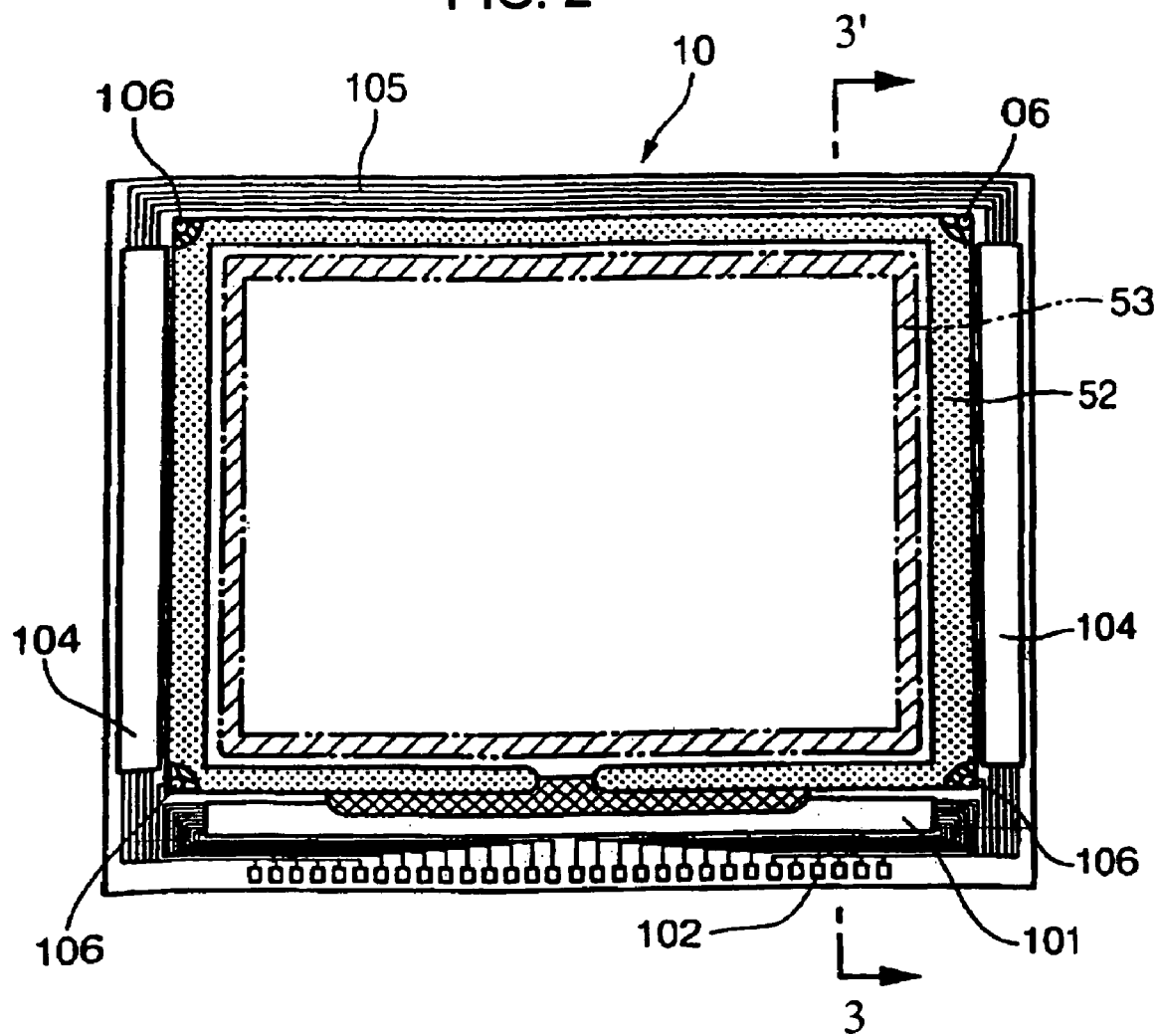
FIG. 2 is a plan view illustrating the overall configuration of the liquid crystal device having the display area shown in FIG. 1.
Figure 3:
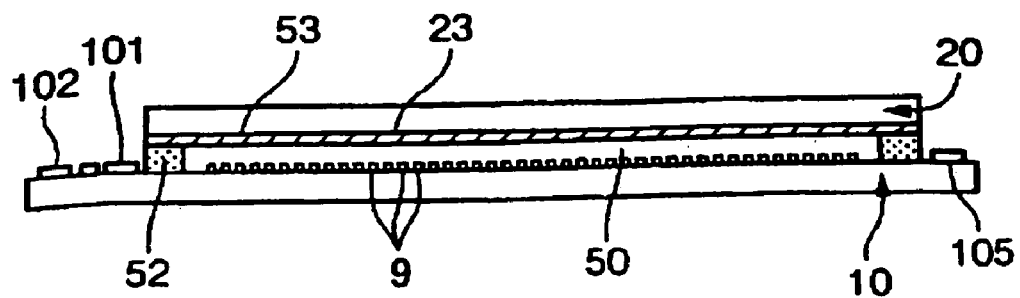
FIG. 3 is a cross-sectional diagram along plane 3–3' in FIG. 2.

FIG. 1 is a schematic illustrating a circuit for the image display area of the liquid crystal device serving as an electro-optical device, according to the present exemplary embodiment of the present invention. FIG. 2 is a plan view wherein a TFT array substrate of the liquid crystal device according to the present exemplary embodiment of the present invention with each component formed on the TFT array substrate viewed from a facing substrate. FIG. 3 is a cross-sectional view taken along plane 3–3' of FIG. 2 including the facing substrate.

In FIG. 1, multiple pixels making up the image display area of the liquid crystal device, according to the present exemplary embodiment, include multiple pixel electrodes 9 which are formed in a matrix pattern, pixel-switching TFTs 30 serving as transistors to control each pixel electrode 9, and data lines 6a for image signals being supplied are electrically connected to sources of the pixel switching TFTs 30. Image signals S1, S2, . . . , Sn, which are to be written to the data lines 6a, may be sequentially supplied in this order, or may be supplied for each group of the multiple data lines 6a neighboring one another.

Moreover, scanning lines 3a are electrically connected to the gates of the pixel switching TFTs 30, and are configured so that scanning signals G1, G2, . . . , Gm are sequentially applied to the scanning lines 3a in pulsed manner in this order at a predetermined timing. The pixel electrodes 9 are electrically connected to the drains of the pixel switching TFTs 30, and the image signals S1, S2, . . . , Sn, provided from the data lines 6a are written according to a predetermined timing by closing the pixel switching TFTs 30 serving as switching devices, in the predetermined timing. The image signals S1, S2, . . . , Sn, with predetermined levels, written to the liquid crystal via the pixel electrodes 9, are held for a predetermined period between the pixel electrodes 9 and a facing electrode formed on the facing substrate (which will be described later). Here, storage capacitors 70 are connected in parallel with liquid crystal capacities formed between the pixel electrodes 9 and the facing electrode in order to prevent the stored image signals from leaking.

Now, the overall configuration of the liquid crystal device having the image display area shown in FIG. 1 will be described.

As shown in FIG. 2 and FIG. 3, the liquid crystal device of the present exemplary embodiment generally includes a TFT array substrate 10 and a facing substrate 20, which are disposed facing one to another, and liquid crystal 50 held between the TFT array substrate 10 and the facing substrate 20. The facing substrate 20 is made up of a glass substrate or quartz substrate or the like, for example, and a shield film 53 in a picture-frame shape is provided on the inner face side of the facing substrate 20 further inside from a seal member 52 in parallel therewith. On the other hand, the TFT array substrate 10 is made up of a quartz substrate, for example, and a data line driving circuit 101 and an external circuit connection terminal 102 are provided on the region outside the seal member 52 along one side of the TFT array substrate 10, and scanning line driving circuits 104 are provided along two sides neighboring the above one side. Note that in the event that the delay of the scanning signals supplied to the scanning lines 3a is acceptable, an arrangement may be made wherein only one of the above scanning line driving circuits 104 is provided.

As shown in FIG. 3, multiple pixel electrodes 9 are provided on the inner face of the TFT array substrate, and an alignment layer (not shown) subjected to predetermined alignment processing, such as rubbing processing or the like are provided thereabove. The pixel electrodes 9 are made up of a transparent electroconductive film, such as an ITO film, for example. The alignment layer is made up of an organic film such as a polyimide film, for example. Pixel switching TFTs, for switching controlling of each pixel electrode 9, are formed at the position neighboring the pixel electrodes 9 of the TFT array substrate 10.

With the inner face of the facing substrate 20, the facing electrode (not shown) is provided over the entire face thereof, and an alignment film (not shown) subjected to predetermined alignment processing, such as rubbing processing is provided underneath the above facing electrode 2, which is not shown in the drawings. The facing electrode is made up of a transparent electroconductive film such as an ITO film or the like. The alignment layer is made up of an organic film such as a polyimide film.

Furthermore, on the facing substrate 20, a second shield film 23 is provided on the region other than the opening region of each pixel unit. Thus, incident light from the facing substrate 20 is not cast onto each pixel switching TFT provided neighboring the pixel electrode 9. Moreover, the second shield film 23 has functions of improving contrast, and preventing of color mixture due to color materials.

Also, the data driving circuit 101 may be disposed at both sides along the sides of the image display area. For example, an arrangement may be made wherein the one data line driving circuit 101, disposed along one side of the image display area, supplies image signals to the odd-numbered lines of the data lines 6a, and the other data line driving circuit 101, disposed along the other side of the image display area, supplies image signals to the even-numbered lines of the data lines 6a. As described above, in the event that the data lines 6a are driven in an interlaced manner, the occupation area of the data line driving circuit 101 can be expanded, thereby enabling a complex circuit to be configured.

Furthermore, multiple wiring 105 is provided on the other side of the TFT array substrate 10 to connect between the scanning line driving circuits 104 provided on both sides of the image display area. Moreover, an electroconductive member 106 is provided at least at one of four corners of the facing substrate 20 to conduct between the TFT array substrate 10 and the facing substrate 20. As shown in FIG. 2, the facing substrate 20, with generally the same outline as the seal member 52, is fixed to the TFT array substrate 10 with the seal member 52.

Liquid crystal is sealed in the space surrounded by the seal member 52 between the TFT array substrate 10 and the facing substrate 20, and thus the liquid crystal layer 50 is formed. The liquid crystal layer 50 exhibits a predetermined alignment state due to the alignment layer on the TFT array substrate 10 side and the alignment layer on the facing substrate 20 side, with no electric field being applied by the pixel electrodes 9. The liquid crystal layer 50 is made up of liquid crystal wherein one or several kinds of nematic liquid crystal exist together, for example. The seal member 52 is an adhesive agent made up of photo-setting resin, thermosetting resin, or the like, for example, for adhering the TFT array substrate 10 and the facing substrate 20 together at the outer edges thereof, and contains spacers such as glass fiber, glass beads, or the like, for the distance between the both substrates being a predetermined value.

Furthermore, a polarizing film, a phase difference film, polarizing means, or the like, is disposed on the side to which projection light from the facing substrate 20 is input, and the side from which output light from the TFT array substrate 10 is output, in a predetermined direction according to the type of action mode such as TN (twisted nematic) mode, STN (super twisted nematic) mode, D-STN (dual scan super twisted nematic) mode, or the like, and normally white mode/normally black mode.

With the liquid crystal device having the configuration described above according to the present invention, the semiconductor layers making up TFTs on the pixel area wherein pixel switching TFTs are formed, and on the perimeter region wherein peripheral circuit TFTs are formed, are formed with different layer thickness on the TFT array substrate.

Figure 4:
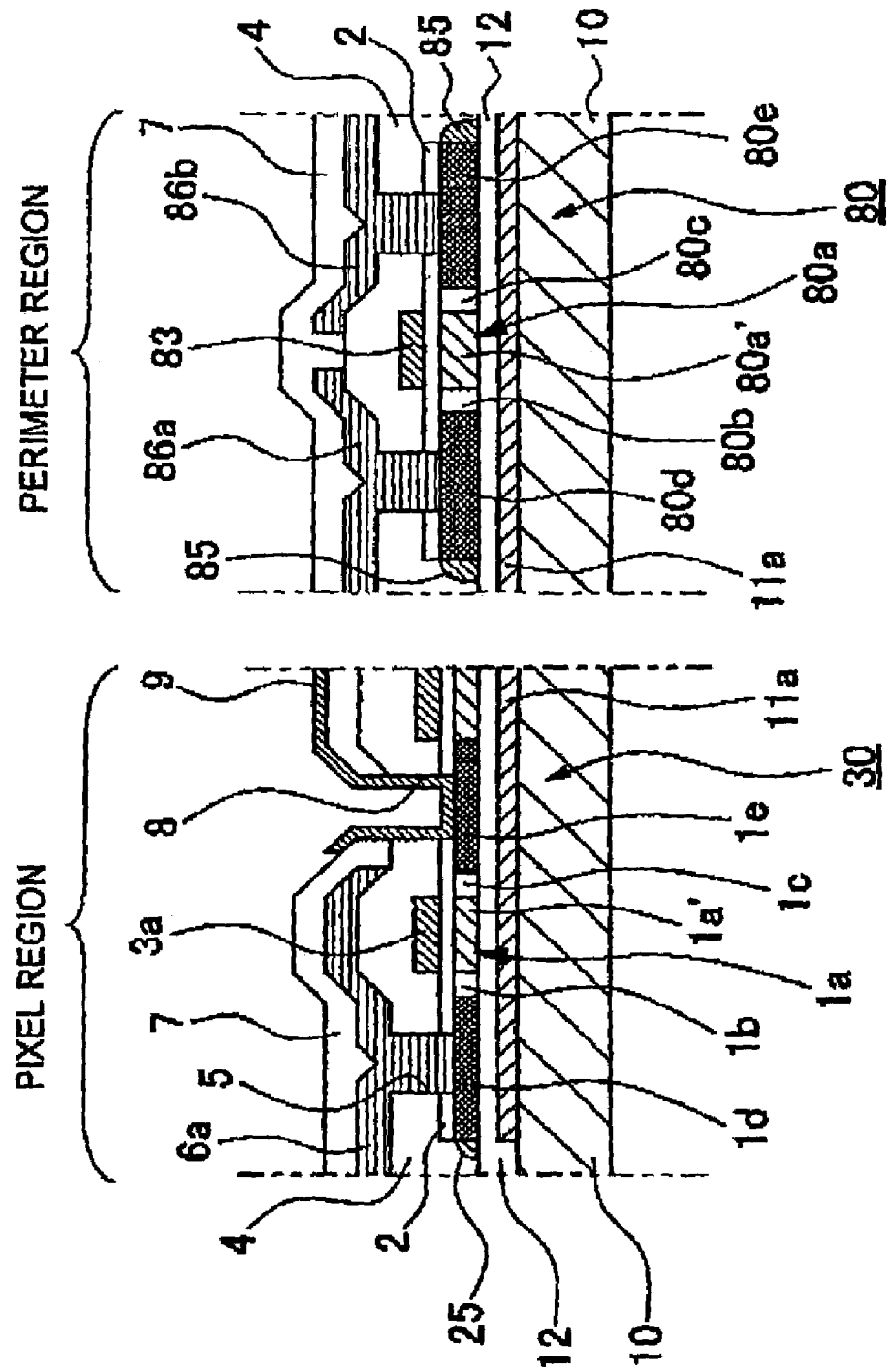
FIG. 4 is a partial cross-sectional schematic wherein the pixel region and perimeter region of the liquid crystal device shown in FIG. 2 are divided, illustrating the TFTs of each.

FIG. 4 is a partial cross-sectional view which illustrates each TFT, the pixel area and the perimeter region being separated, the pixel switching TFT contained in the pixel area are shown on the left side in the drawing, and the peripheral circuit TFT contained in the perimeter region are shown on the right side in the drawing.

The pixel switching TFT 30, shown in the left side in FIG. 4, has an LDD (Lightly Doped Drain) configuration, and includes a scanning line 3a, a channel region 1a' in a semiconductor layer 1a in which channels are formed by the electric field from the scanning line 3a, a gate insulator layer (gate oxidized layer) 2 to insulate the scanning line 3a from the semiconductor layer 1a, a data line 6a, a low concentration source region (LDD region on the source side) 1b and a low concentration drain region (LDD region on the drain side) 1c in the semiconductor layer 1a, and a high concentration source region 1d and a high concentration drain region 1e in the semiconductor layer 1a. A side-face passivation layer 25 is formed on the side face of the semiconductor layer 1a. The scanning line 3a is formed facing the channel region so as to function as a gate electrode.

With the semiconductor layer 1a, the data line 6a is connected to the high concentration source region 1d, and the corresponding one of the multiple pixel electrodes 9, is connected to the high concentration drain region 1e. Also, the source regions 1b, 1d, and the drain regions 1c and 1e, are formed by impurity ions with a predetermined concentration being doped into the semiconductor layer 1a.

The side-face passivation layer 25, made up of an oxidation-resistant material, such as silicon-nitride or the like, is formed on the side face of the semiconductor layer 1a. The pixel switching TFT 30, according to the present exemplary embodiment, is insulated from the scanning line 3a which is a gate electrode by the gate insulator layer 2 on the top face of the semiconductor layer 1a and the side-face passivation layer 25. Due to the configuration as described above being employed, the top face of the semiconductor layer 1a is insulated from the scanning line 3a by the gate insulator layer 2 which is formed with uniform layer thickness. The outer edge and the side face of the semiconductor layer 1a are insulated from the scanning line 3a by the side-face passivation layer 25. Accordingly, with the configuration of the present exemplary embodiment, occurrence of the parasitic MOS phenomenon due to the distance between the scanning line 3a and the semiconductor layer 1a (i.e., the layer thickness of the gate insulator layer 2) becoming partially thin can be efficiently suppressed, thereby enabling TFTs with excellent current characteristics and excellent reliability to be configured.

Furthermore, a first shield layer 11a is provided to the bottom portion of the region on which the semiconductor layer 1a is formed. More specifically, the first shield layer 11a is provided at a position wherein the first shield layer 11a covers the TFT including the channel regions in the semiconductor layer 1a in each pixel as viewed from the TFT array substrate side. The first shield layer 11a preferably is made up of an individual metal, alloy, metal silicide, or the like, including at least one of Ti, Cr, W, Ta, Mo, and Pt, which are opaque high melting metals. Due to the first shield layer 11a being formed, a situation wherein the return light or the like from the TFT array substrate 10 is cast on the channel region 1a' or the LDD regions 1b or 1c of the pixel switching TFT 30 can be prevented beforehand, and thus the properties of the pixel switching TFT 30 as a transistor device do not deteriorate from occurrence of photo-leakage current due to the return light.

The data line 6a is made up of shading metal layer which is a metal layer such as Al or the like, an alloy layer such as metal silicide or the like, or the like. Furthermore, a second intermediate insulator layer 4, wherein are formed a contact hole 5 to the high concentration source region 1d and a contact hole 8 to the high concentration drain region 1e, is formed on the scanning lines 3a, gate insulator layer 2, and a first intermediate insulator substrate 12. The data line 6a is electrically connected to the high concentration source region 1d via the contact hole 5 for contact with the source region 1d. Furthermore, a third intermediate insulator layer 7, where each contact hole 8 to the high concentration drain region 1e is formed, is formed on the data lines 6a and the second intermediate insulator layer 4. The pixel electrode 9a is electrically connected to the high concentration drain region 1e, via the contact hole 8, for the high concentration drain region 1e. The pixel electrodes 9 are provided on the top face of the third intermediate insulator layer 7 having the configuration as described above.

A peripheral circuit TFT 80, shown on the right side in FIG. 4, has the LDD configuration the same as with the pixel switching TFT 30 shown in the left side in the same drawing, and includes a gate electrode 83, a channel region 80a' in a semiconductor layer 80a in which channels are formed by the electric field from the gate electrode 83, the gate insulator layer 2 to insulate the gate electrode 83 from the semiconductor layer 80a, an input signal line 86a, an output signal line 86b, a low concentration source region (source side LDD region) 80b and a low concentration drain region (drain side LDD region) 80c in the semiconductor layer 80a, and a high concentration source region 80d and high concentration drain region 80e in the semiconductor layer 80a.

Also, with the peripheral circuit TFT 80, as with the pixel switching TFT 30, the source regions 80b and 80d, and the drain regions 80c and 80e, are formed by impurity ions with predetermined concentration being doped into the semiconductor layer 80a.

Also, a side-face passivation layer 85 made up of an oxidation-resistant material, such as silicon-nitride or the like is formed on the side face of the semiconductor layer 80a of the peripheral circuit TFT 80. For example, the peripheral circuit TFT 80 according to the present exemplary embodiment is insulated from the gate electrode 83 by the gate insulator layer 2 on the top face side of the semiconductor layer 80a and the side-face passivation layer 85. Due to the configuration as described above being employed, the top face of the semiconductor layer 80a is insulated from the gate electrode 83 by the gate insulator layer 2 which has been formed with uniform layer thickness, and the outer edge and the side face of the semiconductor layer 80a are insulated from the gate electrode 83 by the side-face passivation layer 85. Accordingly, with the configuration of the present exemplary embodiment, occurrence of the parasitic MOS phenomenon, due to the distance between the gate electrode 83 and the semiconductor layer 80a (the film thickness of the gate insulator layer) partially becoming thin, is efficiently suppressed, thereby enabling the TFTs with excellent current characteristics and excellent reliability to be configured.

As shown in FIG. 4, the semiconductor layer 1a for pixel switching TFT 30 is formed with a layer thickness less than that of the semiconductor layer 80a for the peripheral circuit TFT 80. Due to the above-described configuration being employed, photo-leakage current can be reduced with the pixel switching TFT 30. On the other hand, with the peripheral circuit-TFTs 80, while large current driving capability is required to drive scanning lines and data lines, the semiconductor layer 80a is formed with great layer thickness, thereby facilitating obtaining of large current at the scanning line driving circuit 104 and the data line driving circuit 101.

While the thickness of the semiconductor layer 1a making up the pixel switching TFTs 30 is not specifically restricted, the thickness is within the range between 30 nm and 100 nm, and is preferably within the range between 30 nm and 80 nm, and is more preferably within the range between 40 nm and 60 nm, which is a uniform layer thickness.

In the event that the layer thickness of the semiconductor layer 1a is equal to or less than 100 nm, the depletion layer controlled by the gate electrode is expanded beyond the semiconductor layer 1a regardless of the impurity concentration in the channel portions, and accordingly, the pixel switching TFT 30 is formed into the complete depletion type. Furthermore; in a case that the layer thickness of the semiconductor layer 1a is equal to or less than 100 nm, preferably is equal to or less than 80 nm, and more preferably is equal to or less than 60 nm, even in the event that stray light which has not been prevented by the first shield layer 11a is cast on the semiconductor layer 1a, the generated amount of electron-hole pairs due to photo-excitation is small. Accordingly, the photo-leakage current can be suppressed to a small value, thereby being effective in the pixel switching TFT 30 which is a switching device for a pixel.

Furthermore, in the event that the layer thickness of the semiconductor layer 1a is equal to or greater than 30 nm, and is preferably equal to or greater than 40 nm, the irregularities of the transistor characteristics, such as the threshold voltage or the like due to fluctuation of the layer thickness of the channel region 1a' can be reduced. Moreover, the contact resistance does not increase.

Furthermore, while the layer thickness of the semiconductor layer 80a making up the peripheral circuit TFTs 80 is not specifically restricted, the layer thickness is preferably in the range between 100 nm and 600 nm, and is more preferably in the range between 150 nm and the 400 μm, which is uniform layer thickness.

In the event that the layer thickness of the semiconductor layer 80a is equal to or greater than 100 nm, and is preferably equal to or more than 150 nm, sufficient voltage withstanding capabilities are obtained, and also the sheet resistance is reduced to a sufficiently small value, so the peripheral circuit can obtain sufficient current driving capability, thereby enabling a driving circuit which can be driven at high speeds to be configured.

The layer thickness of the semiconductor layer 80a, equal to or more than 600 nm, could lead to difficulty in manufacturing, such as occurrence of irregularities of the layer thickness in the etching process wherein the semiconductor layer 1a is formed for the pixel switching TFTs 30, which is undesirable.

Manufacturing Methods for Electro-Optical Device

Figure 9:
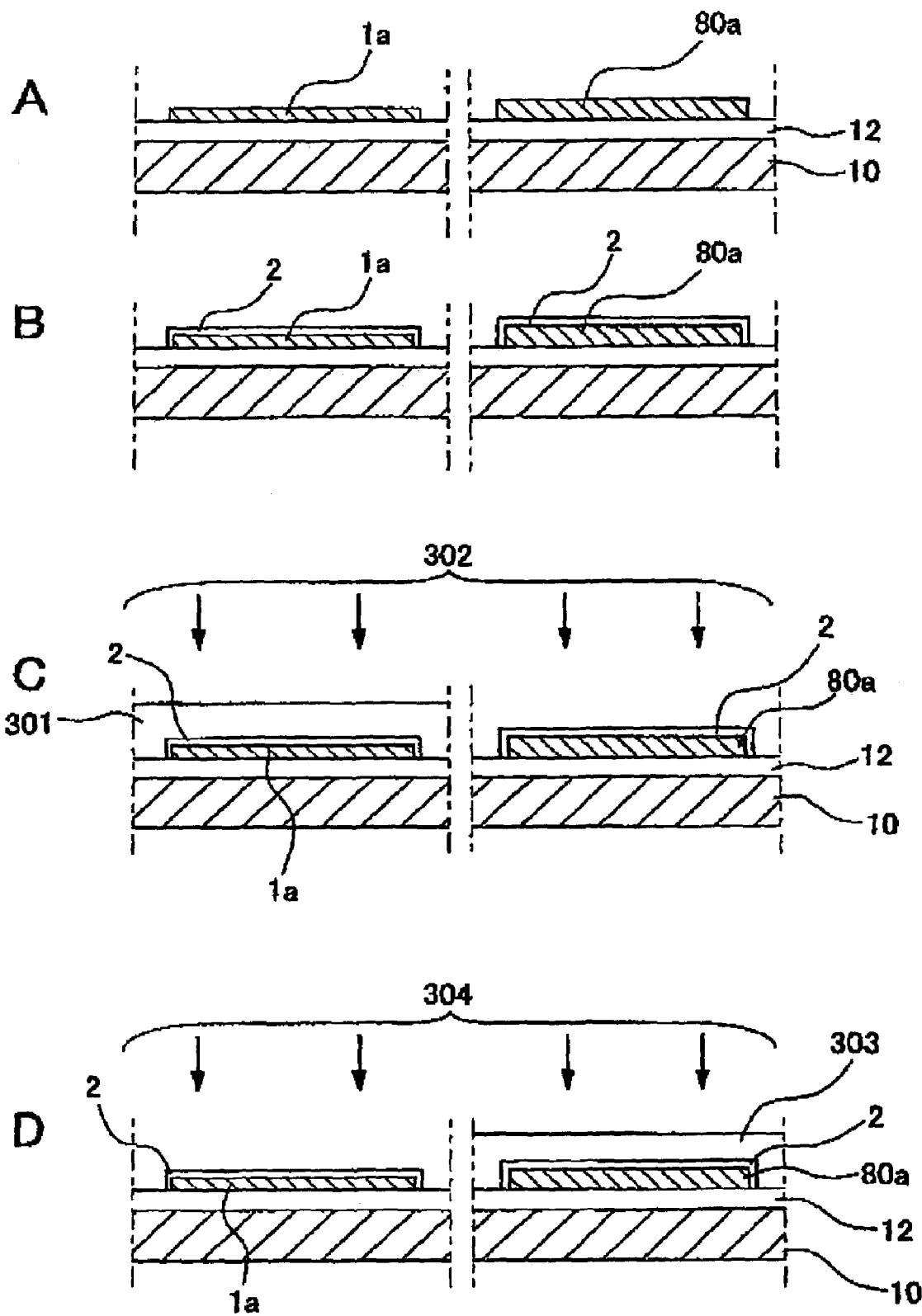
FIGS. 9A–9D are cross-sectional procedure diagrams illustrating a formation method for a transistor device using the electro-optical device according to the present invention.
Figure 11:
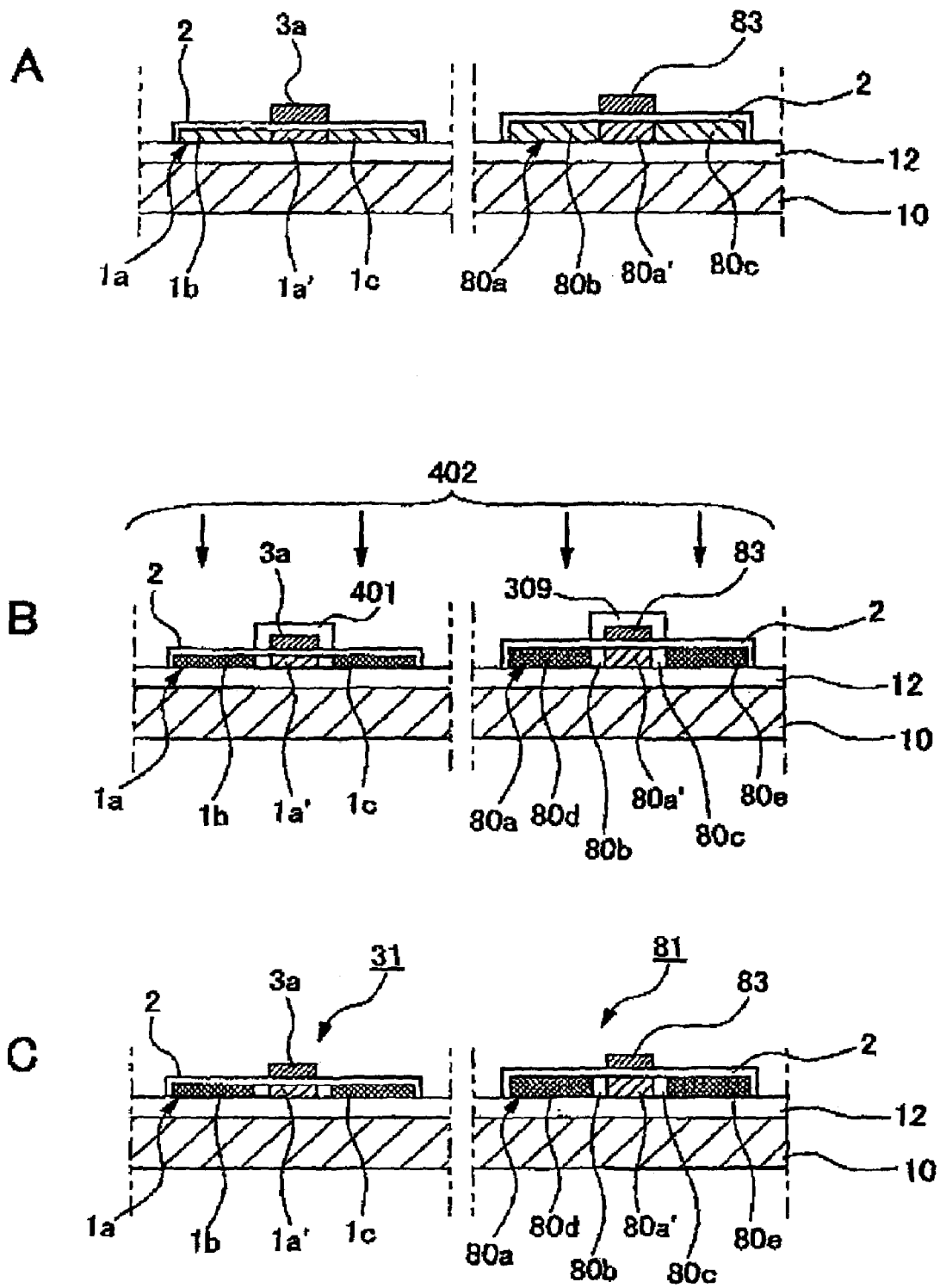
FIGS. 11A–11C are cross-sectional procedure diagrams illustrating a formation method for a transistor device using the electro-optical device according to the present invention.

Description will now be made regarding a manufacturing method for electro-optical devices which are applied to a liquid crystal device shown in FIG. 2 through FIG. 4 with reference to the drawings. Note that the features of the present invention are the configuration of the semiconductor layers 1a and 80a for making up the above-described TFTs 30 and 80, and the transistor device which is formed on the semiconductor layers 1a and 80a. So description will be made regarding four embodiments with regard to the formation methods for the semiconductor layers 1a and 80a with reference to FIG. 5 through FIG. 8, and description will be made regarding the formation methods for transistor devices on the semiconductor layers 1a and 80a with reference to FIG. 9 through FIG. 11. Note that, with the manufacturing processes for TFTs 30 and 80 following formation of the transistor devices, conventional manufacturing methods can be employed.

First Exemplary Embodiment

FIGS. 5A–5E are cross-sectional process schematics which illustrate manufacturing processes for electro-optical devices using the manufacturing method, according to the present invention.

Figure 5:
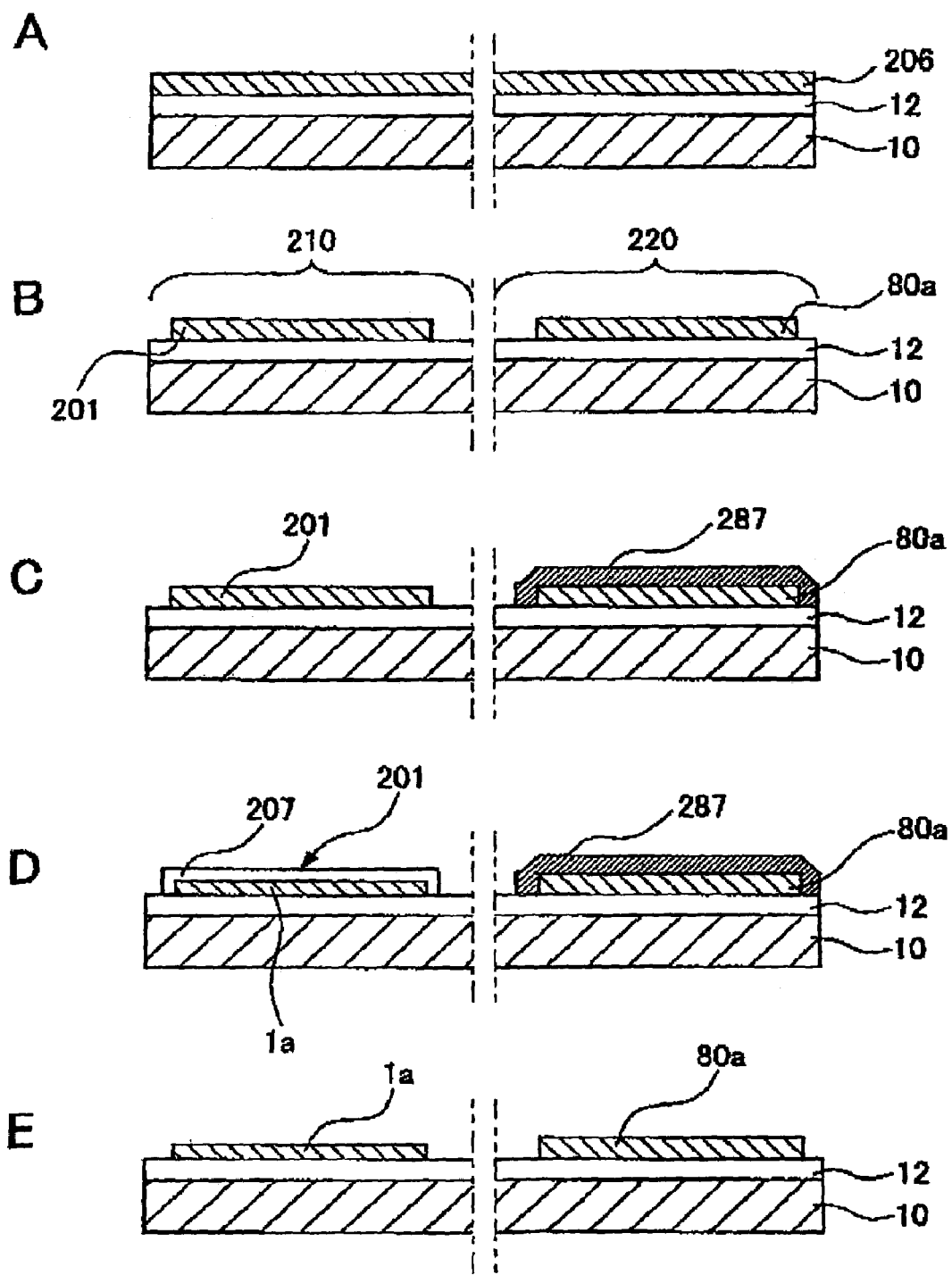
FIGS. 5A–5E are cross-sectional procedure diagrams illustrating a first exemplary embodiment of a manufacturing method for an electro-optical device according to the present invention.

First, as shown in FIG. 5A, an SOI substrate having a mono-crystalline silicon layer 206 which has been formed on the support substrate 10 made up of glass, quartz, or the like, with the insulator layer 12 made up of silicon-oxide or the like introduced therebetween, is prepared. The SOI substrate shown in FIG. 5 can be manufactured using suitable methods. Also, a shield film may be disposed within the insulator layer 12 or between the insulator layer 12 and the support substrate 10.

With the SOI substrate having the shield film, the shield film is formed in a predetermined pattern on the support substrate 10, for example, and subsequently, the insulator layer 12 is formed on the support substrate 10 on which the shield film has been formed, and the surface is polished for smoothing.

Subsequently a single-crystal substrate wherein an oxidized layer has been formed on the face which is to be adhered and hydrogen ions (H+) have been injected is adhered onto the insulator layer 12, and thermal-processing is performed so that the mono-crystalline silicon substrate is separated on the portion wherein hydrogen ions have been injected, and a mono-crystalline silicon layer 206 is formed, thereby enabling the SOI substrate with a shield film to be manufactured.

Next, as shown in FIG. 5B, the mono-crystalline silicon layer 206 is subjected to patterning in a predetermined pattern. With the present exemplary embodiment, the mono-crystalline silicon layer 206 is separated into a first semiconductor region 210 (see on the left side in the drawing) and a second semiconductor region 220 (see on the right side in the drawing), and a first semiconductor layer 201 is formed in a predetermined pattern on the first semiconductor region 210, and a second semiconductor layer 80a is formed on the second semiconductor region 220. The present patterning process can be performed by combination of known photolithography, etching, and the like.

With the manufacturing method of the present exemplary embodiment, the mono-crystalline silicon layer 206 with uniform layer thickness is subjected to patterning, and accordingly, the insulator layer 12 underneath the semiconductor layer 206 is not subjected to over-etching, and also, the depth of etching can be made uniform, thereby facilitating the etching process itself, and accordingly patterning with higher precision can be easily performed.

Next, as shown in FIG. 5C, a mask member 287 made up of an oxidation-resistant material, such as silicon-nitride or the like, is formed so as to cover the second semiconductor layer 80a on the second semiconductor region 220 side. The mask member 287 can be formed using the method wherein a silicon-nitride layer is formed on the second semiconductor region 220 by the plasma CVD method, the decompression CVD method, the sputter method, or the like, with the first semiconductor region being masked, or a method wherein a silicon-nitride layer is formed on the entire face so as to cover the first and second semiconductor regions 210 and 220, and subsequently, the silicon-nitride layer on the first semiconductor region 210 is removed by the photolithography process, etching process, or the like.

Next, as shown in FIG. 5D, the surface of the first semiconductor layer 210 is oxidized by thermal-oxidation process or the like, so as to form an oxidized layer 207 on the surface of the first semiconductor layer 201. In the oxidation process, the layer thickness of the oxidized layer 207 formed on the first semiconductor layer 201 is adjusted by suitably changing the oxidation conditions, and accordingly, the thickness of the first semiconductor layer following removal of the oxidized layer 207 can be adjusted. Note that, with the present process, the second semiconductor layer 80a is protected by the mask member 287 made up of an oxidation-resistant material, so is not oxidized.

Subsequently, the oxidized layer 207 on the first semiconductor layer 201 and the mask member 287 on the second semiconductor layer 80a are removed by etching process or the like, thereby obtaining an electro-optical device having the first semiconductor layer 1a subjected to thin-layer formation and the second semiconductor layer 80a with layer thickness greater than that of the first semiconductor layer 1a as shown in FIG. 5E.

With the manufacturing method having the configuration described above, according to the present exemplary embodiment, semiconductor layers with different layer thickness can be easily formed on an SOI substrate. Also, the patterning process (see FIG. 5B) comes before the thin-layer formation process of the semiconductor layer (see FIG. 5D), so the patterning process can be performed with the layer thickness of the semiconductor layer 206 being uniform on the substrate 10, and accordingly, the patterning can be performed extremely easily, and also occurrence of over-etching with regard to the insulator layer 12 can be prevented. Also, with the manufacturing method according to the present exemplary embodiment, with the process shown in FIG. 5D, the mono-crystalline silicon layer 206 is separated into the first semiconductor layer 201 and the second semiconductor layer 80a prior to oxidation of the surface of the mono-crystalline silicon layer 206, and accordingly, the area of the mono-crystalline semiconductor layer can be reduced, and thus, occurrence of defects, such as slips in the mono-crystalline silicon layer or the like, due to the difference between thermal expansion ratios of the mono-crystalline semiconductor layer and the thermal-oxidized layer, can be easily prevented. Thus, with the manufacturing method of the present exemplary embodiment, the pattern of the semiconductor layer can be controlled with high precision, thereby enabling electro-optical devices to be manufactured with a high yield.

Second Exemplary Embodiment

Figure 6:
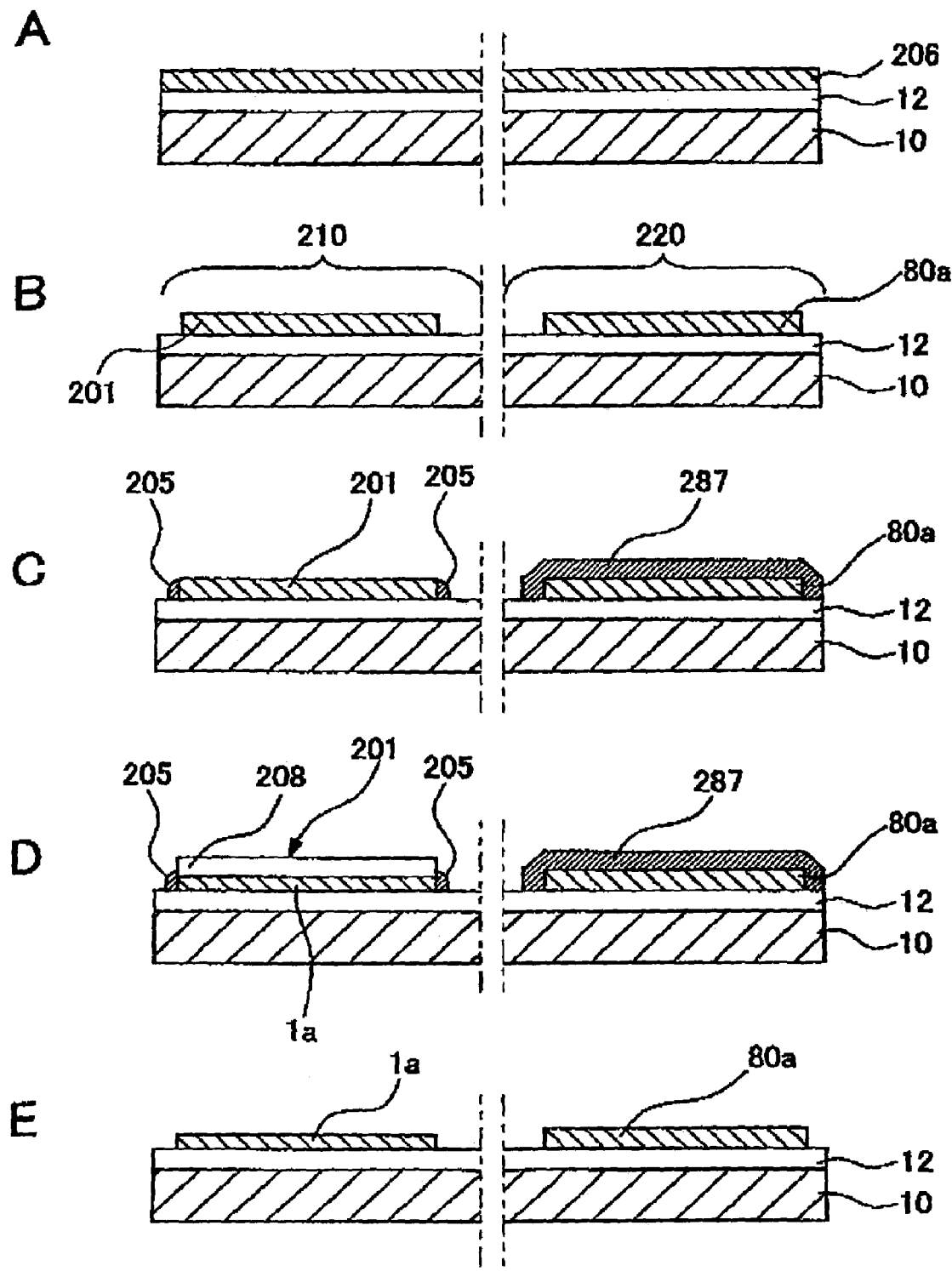
FIGS. 6A–6E are cross-sectional procedure diagrams illustrating a second exemplary embodiment of a manufacturing method for an electro-optical device according to the present invention.
Figure 7:
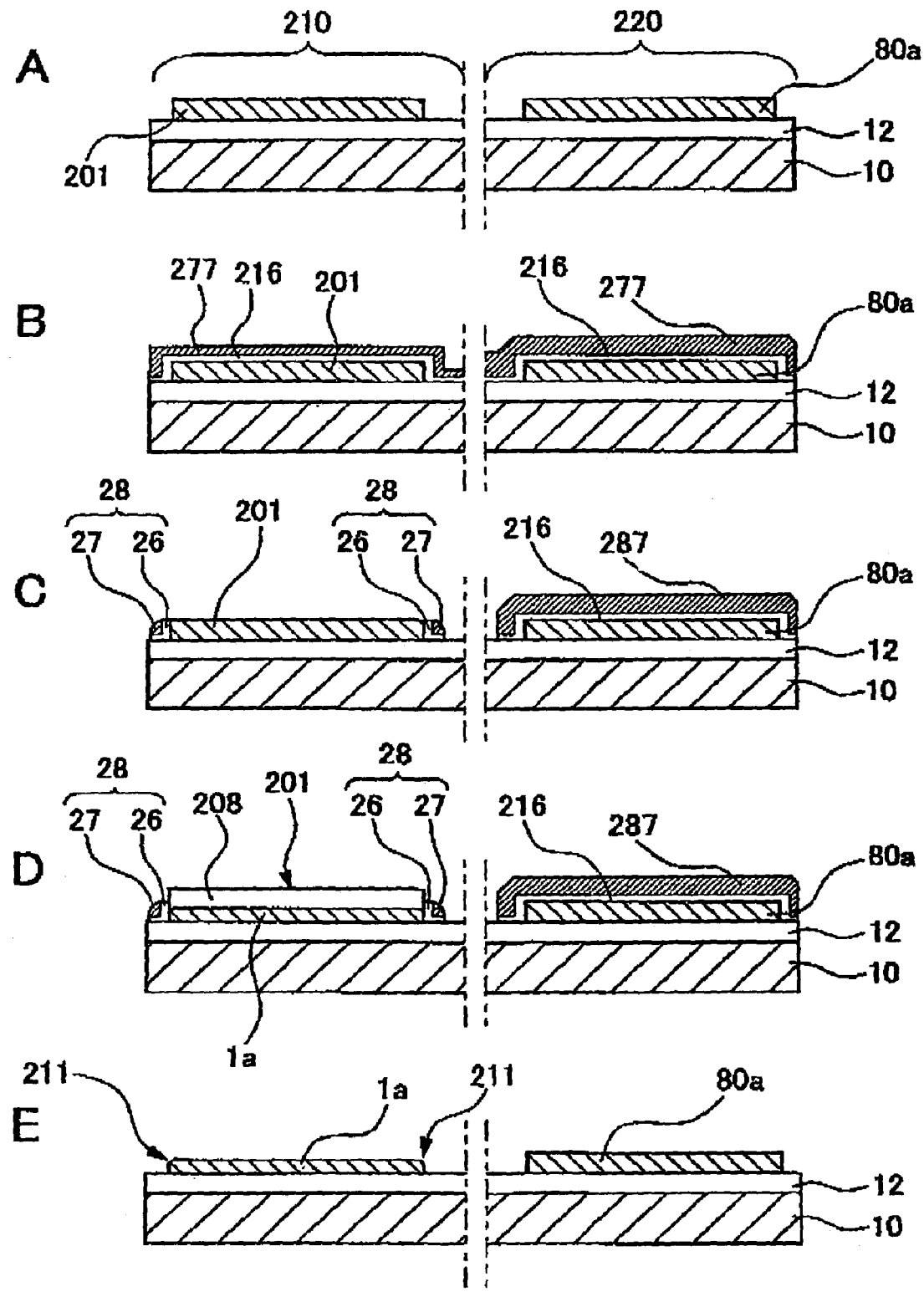
FIGS. 7A–7E are cross-sectional procedure diagrams illustrating a third exemplary embodiment of a manufacturing method for an electro-optical device according to the present invention.
Figure 8:
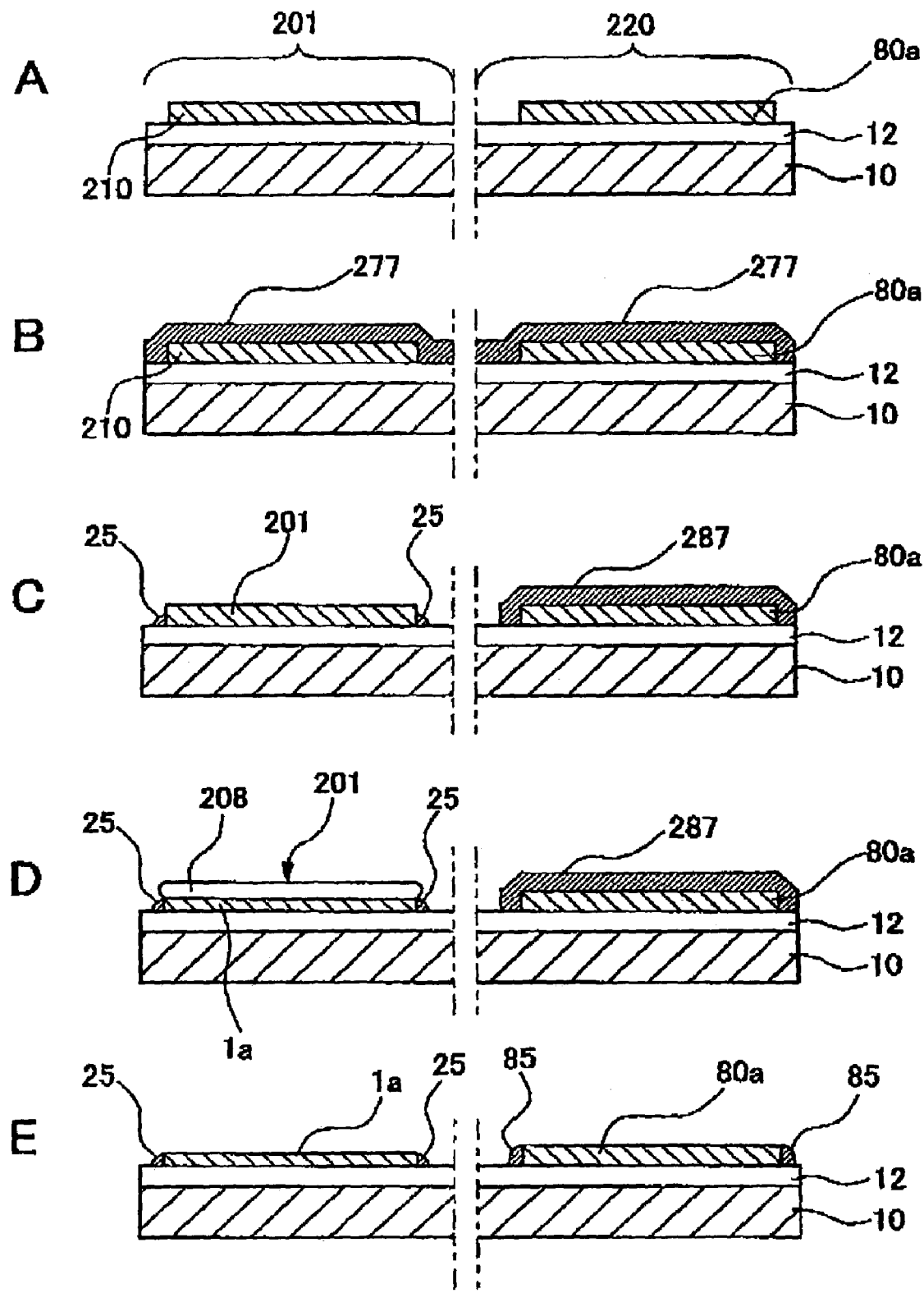
FIGS. 8A–8E are cross-sectional procedure diagrams illustrating a fourth exemplary embodiment of a manufacturing method for an electro-optical device according to the present invention.

FIGS. 6A–6E are cross-sectional process schematics which illustrate the manufacturing processes for an electro-optical device of a second exemplary embodiment with regard to manufacturing methods according to the present invention. The feature of the manufacturing method according to the present exemplary embodiment shown in FIG. 6, is that the first semiconductor layer 201 is subjected to thin-layer formation following the side-face passivation layer 205 being formed on the side face of the first semiconductor layer 201 on the first semiconductor region 210. With the present exemplary embodiment, the processes up to the patterning process shown in FIG. 6B are the same as with the first exemplary embodiment shown in FIG. 5, so detailed description will now be omitted. Also, the reference numerals in FIG. 6, the same as in FIG. 5, denote the same members as shown in FIG. 1.

As shown in FIG. 6B, following the semiconductor layers 201 and 80a being formed on the first semiconductor region 210 and the second semiconductor region 220 by patterning of the semiconductor layer 206, an oxidation-resistant silicon-nitride layer is formed on the entire face of the semiconductor layer on the substrate 10 so as to cover the semiconductor layers 201 and 80a. Subsequently, as shown in FIG. 6C, the silicon-nitride layer covering the second semiconductor layer 80a is left as a mask member 287, and the side-face passivation layer 205 which covers the side face of the first semiconductor layer 201 is formed by the photolithography process, etching process, and the like. The side-face passivation layer 205 can be formed by adjusting the etching conditions for silicon-nitride, and selectively performing etching so as to removing the silicon-nitride formed on the top face of the first semiconductor layer 201 with the silicon-nitride layer on the side face of the semiconductor layer 201 being left.

Subsequently, as shown in FIG. 6D, an oxidized layer 208 is formed by oxidizing the top face of the first semiconductor layer 201 using thermal oxidation process or the like. With the oxidation process, the side face of the first semiconductor layer 201 is protected by the above-described side-face passivation layer 205, and accordingly is not oxidized, and thus only the top face of the first semiconductor layer 201 is oxidized.

Subsequently, the oxidized layer 208, the side-face passivation layer 205, and the mask member 287 are removed by etching process so that an electro-optical device having the first semiconductor layer 1a subjected to thin-layer formation and the second semiconductor layer 80a shown in FIG. 6E is obtained.

With the manufacturing method of the present exemplary embodiment as described above, the surface of the first semiconductor layer 201 is oxidized with the side-face passivation layer 205 being provided to the side face of the first semiconductor layer 201, so the side face of the first semiconductor layer 201 is not oxidized, and accordingly, only the layer thickness of the first semiconductor layer 201 can be made thin while maintaining the area dimensions of the first semiconductor layer 201, after patterning as shown in FIG. 6B, following removal of the oxidized layer 208. Moreover, with the manufacturing method of the present exemplary embodiment, the side face of the first semiconductor layer 201 is not subjected to etching. Accordingly, the shape of the first semiconductor layer 1a subjected to thin-layer formation can be controlled more accurately. Furthermore, with the manufacturing method of the present exemplary embodiment, as with the first exemplary embodiment, the mono-crystalline silicon layer 206 is separated into the first semiconductor layer 201 and the second semiconductor layer 80a prior to performing oxidation of the surface of the mono-crystalline silicon layer in the process shown in FIG. 6D, and accordingly, the area size of the mono-crystalline silicon layer can be reduced, thereby allowing occurrence of defects, such as slips or the like, in the mono-crystalline silicon layer, due to the difference between thermal-expansion ratios of the mono-crystalline silicon layer and thermal-oxidized layer to be easily prevented.

There is no particular need for the side-face passivation layer 205 to removed; an electro-optical device with the side-face passivation layer 205 left on the side face of the first semiconductor layer 1a may be manufactured. As described above, in the event that transistor devices, for example, are formed on the first semiconductor layer 1a with the side-face passivation layer 205 being left, the surface of the first semiconductor layer 1a is oxidized in the gate oxidation process, but the side face of the first semiconductor layer 1a is not oxidized du to the side-face passivation layer 205, and a gate oxidation layer is formed on only the top face of the first semiconductor layer 1a. The gate oxidation layer, formed as described above, is not thin around outer edge of the first semiconductor layer 1a, thereby enabling occurrence of the parasitic MOS phenomenon on the transistor devices to be prevented.

Note that, with the present exemplary embodiment, while description has been made regarding the configuration wherein the side-face passivation layer 205 is provided to only the first semiconductor layer 201, the side-face passivation layer having the same configuration may be formed on the second semiconductor layer 80a, and the same advantages as described above can be obtained in this case as well.

Third Exemplary Embodiment

FIGS. 7A–7E are cross-sectional process schematics which illustrate the manufacturing process for electro-optical devices according to a manufacturing method of a third exemplary embodiment of the present invention. The features of the manufacturing method of the present exemplary embodiment, shown in FIG. 3, are that the first semiconductor layer 201 is subjected to thin-layer formation following a side-face passivation layer being formed on the side face of the first semiconductor layer 201 on the first semiconductor region 210, and the side-face passivation layer has a configuration wherein an oxidized layer and an oxidation-resistant layer are formed in a layered manner. With the present exemplary embodiment, the processes indicated up to the patterning process shown in FIG. 7A are the same as with the above-described first embodiment shown in FIG. 5A and FIG. 5B, so detailed description will be omitted here. Also, the reference numerals in FIGS. 7A–7E which are the same as those in FIGS. 5A–5E, denote the same members shown in FIG. 5.

Following the semiconductor layers 201 and 80a being formed on the first semiconductor region 210 and the second semiconductor region 220 by patterning of the semiconductor layer as shown in FIG. 7A, the silicon-oxide layer 216 is formed so as to cover the semiconductor layers 201 and 80a, and an oxidation-resistant silicon-nitride layer 277 is formed to cover the silicon-oxide layer 216 as shown in FIG. 7B. For example, the silicon-oxide layer 216 and the silicon-nitride layer 277 are layered on the first semiconductor layer 201 and second semiconductor layer 80a.

Subsequently, as shown in FIG. 7C, the silicon-oxide layer 216 and the silicon-nitride layer 277 formed on the top face of the first semiconductor layer 201 are removed while leaving the silicon-nitride layer 277 covering the second semiconductor region 80a as a mask member 287, and also the side-face passivation layer 28 is formed to cover the side face of the first semiconductor layer 201 using photolithography process, etching process, and the like. The side-face passivation layer 28 has a configuration, the silicon-nitride layer (oxidation-resistant layer) 27 being layered on the silicon-oxide layer (oxidized layer) 26. Note that the side-face passivation layer 28 can be formed by the same method as with the side-face passivation layer 205 provided on the semiconductor layer according to the above-described second exemplary embodiment.

Subsequently, as shown in FIG. 7D, the oxidized layer 208 is formed by oxidizing the top face of the first semiconductor layer 201 using thermal-oxidation process or the like. While, with the oxidation-process, the side face of the first semiconductor layer 201 is protected by the side-face passivation layer 205, and accordingly is not oxidized, and only the top face of the first semiconductor layer 201 is oxidized, with the present exemplary embodiment, the semiconductor layer 201 side of the side-face passivation layer 28 is made up of the silicon-oxide layer 26, and accordingly, oxidation radicals can easily invade the side edge of the semiconductor layer 201, and thus the layer thickness of the oxidized layer 208 is made somewhat greater around the outer edge of the first semiconductor layer 201.

Subsequently, the oxidized layer 208, the side-face passivation layer 28, and the mask member 287 are removed by etching process so as to obtain an electro-optical device having the first semiconductor layer 1a subjected to thin-layer formation and the second semiconductor layer 80a shown in FIG. 7E.

With the manufacturing method of the above-described present exemplary embodiment, the surface of the first semiconductor layer 201 is oxidized with the side-face passivation layer 28 being provided on the side face of the first semiconductor layer 201, and accordingly, the side face of the first semiconductor layer 201 is not oxidized. Only the layer thickness of the first semiconductor layer 201 can be made thin while maintaining the area dimensions of the first semiconductor layer 201, after the patterning shown in FIG. 2B, following removal of the oxidized layer 208. Also, with the manufacturing method of the present exemplary embodiment, the side face of the first semiconductor layer 201 is not subjected to etching. Accordingly, the shape of the first semiconductor layer 1a, subjected to thin-layer formation, can be controlled with higher precision. Also, with the manufacturing method of the present exemplary embodiment, the mono-crystalline silicon layer 206 is separated into the first semiconductor layer 201 and the second semiconductor layer 80a prior to oxidation of the surface of the mono-crystalline silicon layer 206 in the process shown in FIG. 7D. Accordingly, the area of the mono-crystalline silicon layer can be reduced, thereby enabling occurrence of defects, such as slips or the like, in the mono-crystalline silicon layer, due to the difference in thermal expansion of the mono-crystalline silicon layer and the thermal-oxidized layer to be easily prevented.

Furthermore, with the manufacturing method according to the present exemplary embodiment, the layer thickness of the oxidized layer 208 is somewhat greater around the outer edge of the semiconductor layer as described above, and accordingly, a curved face portions 211 are formed around the outer edge of the first semiconductor layer 1a subjected to thin-layer formation. In a case that the curved face portions 211 are formed as described above, in the event that the first semiconductor layer 1a is subjected to gate oxidation, the layer thickness of the gate oxidized layer becomes thin around the outer edge of the semiconductor layer 1a, thereby enabling occurrence of the parasitic MOS phenomenon to be effectively prevented.

Note that, with the manufacturing method of the present exemplary embodiment, the side-face passivation layer 28 may be left without removal. In the event that the side-face passivation layer 28 is left on the side face of the first semiconductor layer 1a, when performing gate-oxidation for the first semiconductor layer 1a, the silicon- oxide layer 26 has been already formed on the side face of the first semiconductor layer 1a, and the gate oxidized layer does not become thin around the outer edge of the semiconductor layer 1a, thereby enabling transistor devices with higher reliability to be formed.

While, with the present exemplary embodiment, description has been made regarding the configuration wherein the side-face passivation layer 28 is provided to only the first semiconductor layer 201, a side-face passivation layer having the same configuration may be formed on the second semiconductor layer 80a, and in this case, the same advantages can also be obtained.

Fourth Exemplary Embodiment

FIGS. 8A–8E are cross-sectional process schematics which illustrate a manufacturing process for electro-optical devices according to a manufacturing method of a fourth exemplary embodiment according to the present invention. The feature of the manufacturing method of the present exemplary embodiment, described in FIGS. 8A–8E, is that while thin-layer formation of the first semiconductor layer 201 is performed following formation of a side-face passivation layer on the side face of the first semiconductor layer 201 of the first semiconductor region 210, the side-face passivation layer is formed with generally the same height as that of the first semiconductor layer 201 subjected to thin-layer formation. With the present exemplary embodiment, the processes indicated up to the patterning process shown in FIG. 8A are the same with the above-described exemplary embodiment shown in FIG. 5A and FIG. 5B, so detailed description will now be omitted. Also, the same reference numerals shown in FIGS. 8A–8E as in FIGS. 5A–5E denote the same members shown in FIGS. 5A–5E.

Following formation of the first semiconductor region 210 and the second semiconductor region 220 by patterning of the semiconductor layer as shown in FIG. 8A, the oxidation-resistant silicon-nitride layer 277 is formed on the entire semiconductor layer on the substrate 10 so as to cover the semiconductor layers 201 and 80a as shown in FIG. 8B.

Subsequently, the silicon-nitride layer 277 formed on the top face of the first semiconductor layer 201 is removed while leaving the silicon-nitride layer 277 covering the second semiconductor layer 80a as the mask member 287 as shown in FIG. 8C. Also the side- face passivation layer 25 is formed to cover the side face of the first semiconductor layer 201 using the photolithography process, etching process, and the like. With the manufacturing method according to the present exemplary embodiment, the side-face passivation layer 25 is formed with the generally same height as that of the first semiconductor layer 1a after thin-layer formation (see FIG. 8E). With the height of the side-face passivation layer 25, the side- face passivation layer with a predetermined height can be easily formed by adjusting the etching conditions for the silicon-nitride layer so as to adjust the ratio wherein the silicon- nitride layer is left on the side face of the semiconductor layer 201.

Subsequently, as shown in FIG. 8D, the top side of the first semiconductor layer 201 is oxidized by the thermal-oxidation process or the like, so as to form the oxidized layer 208. In the oxidation process, the side face of the first semiconductor layer 201 is protected by the side-face passivation layer 205, and accordingly is not oxidized, and only the top side of the first semiconductor layer 201 is oxidized. The oxidized layer 208 on the first semiconductor layer 201 is formed so as to leave the semiconductor layer with the same height as with the side-face passivation layer 25.

Subsequently, the oxidized layer 208, the side-face passivation layer 205, and the mask member 287 are removed in the etching process, thereby obtaining an electro- optical device having the first semiconductor layer 1a subjected to thin-layer formation and the second semiconductor layer 80a as shown in FIG. 8E. Also, as shown in FIG. 8E, the side-face passivation layer 25 and the side-face passivation layer 85 are formed on the side face of the first semiconductor layer 1a and the second semiconductor layer 80a, and these side-face passivation layers 25 and 85 are formed with generally the same heights as the layer thickness of the semiconductor layers 1a and 80a, on which the side-face passivation layers 25 and 85 are formed, respectively. The side-face passivation layers 25 and 85 are preferably formed with heights generally equal to or somewhat greater than the layer thickness of the semiconductor layers 1a and 80a. In a case that the heights of the side-face passivation layers 25 and 85 are too low, in the event that the semiconductor layers 1a and 80a are subjected to gate-oxidation, the layer thickness of the gate oxidized layer becomes thin around the outer edge of the semiconductor layer, and consequently, the parasitic MOS phenomenon readily occurs.

Note that the side-face passivation layer 85 of the second semiconductor layer 80a can be formed by adjusting the etching conditions wherein the mask member 287 is removed.

With the manufacturing method of the above-described present exemplary embodiment, the surface of the first semiconductor layer 201 is oxidized with the side-face passivation layer 25 being provided on the side face of the first semiconductor layer 201, and accordingly, the side face of the first semiconductor layer 201 is not oxidized, and furthermore, only the layer thickness of the first semiconductor layer 201 can be made thin, while maintaining the area dimensions of the first semiconductor layer 201, after the patterning shown in FIG. 2B following removal of the oxidized layer 208. Also, with the manufacturing method of the present exemplary embodiment, the side face of the semiconductor layer 201 is not subjected to etching. Accordingly, the shape of the first semiconductor layer 1a subjected to thin-layer formation can be controlled with more precision. Furthermore, with the manufacturing method according to the present exemplary embodiment, the mono-crystalline silicon layer 206 is separated into the first semiconductor layer 201 and the second semiconductor layer 80a prior to oxidation of the surface of the mono-crystalline silicon layer 206 in the process shown in FIG. 8D. The area of the mono crystalline silicon layer can be reduced, thereby enabling occurrence of defects, such as slips or the like, in the mono-crystalline silicon layer, due to the difference in thermal expansion of the mono-crystalline silicon layer and the thermal-oxidized layer to be easily prevented.

Moreover, the height of the side-face passivation layer 25 and the layer thickness of the oxidized layer 208 on the first semiconductor layer 201 are controlled, so the layer thickness of the semiconductor layer 1a subjected to thin-layer formation, and the height of the side-face passivation layer 25 is generally the same, thereby facilitating the gate oxidized layer subjected to gate-oxidation to be formed with a uniform layer thickness, and thus the gate oxidized layer does not become thin around the outer edge of the semiconductor layer 1a.

Formation Method for Transistor Devices

Now, detailed description will be made regarding a manufacturing process wherein TFTs are formed on semiconductor regions with different thickness as with the TFTs 30 and 80 of the liquid crystal device shown in FIG. 4, taking an electro-optical device manufactured with one of the manufacturing processes shown in FIGS. 5A–5E through FIGS. 8A–8E as an example, with reference to the drawings.

FIGS. 9A–9D through FIGS. 11A–11C are cross-sectional process schematics which illustrate formation processes for transistor devices onto the semiconductor layer of the electro-optical device according to the present invention. In these drawings, while the configuration is shown with the same components as in FIGS. 5A–5E, the configuration is not shown with the same components as in FIGS. 6A–6E through FIGS. 8A–8E. The same components as in FIGS. 5A–5E are denoted by the same reference numerals. Also, in FIGS. 9A–9D through FIGS. 11A–11C, the first shield film 1a provided to the transistor device shown in FIG. 4 is omitted. Note that transistor devices can also be formed with generally the same process, using the electro-optical device manufactured with one of processes shown in FIGS. 5A–5E through FIGS. 8A–8E. Accordingly, while an arrangement wherein the SOI substrate with the side-face passivation layers 25 and 85 not being provided shown in FIGS. 5A–5E is employed, is shown in FIGS. 9A–9D through FIGS. 11A–11C, description will also be made below as appropriate regarding an arrangement wherein the SOI substrate with the side-face passivation layers 25 and 85 being provided shown in FIGS. 8A–8E is employed.

With the transistor device formation process described below, in the event that the SOI substrate shown in FIGS. 8A–8E is employed instead of the SOI substrate shown in FIG. 9A, transistor devices with the side-face passivation layer being provided on the side face of the TFTs can be formed as shown in FIG. 4.

First of all, as shown in FIG. 9A, an SOI substrate on which the semiconductor layers 1a and 80a are formed in a predetermined pattern by the photolithography process, etching process, or the like, is prepared. The SOI substrate can be manufactured with the manufacturing process shown in FIGS. 5A–5E. In the event that the SOI substrate shown in FIGS. 8A–8E is employed, the side-face passivation layers 25 and 85 are formed on the side faces of the semiconductor layers 1a and 80a.

Subsequently the semiconductor layers 1a and 80a are subjected to thermal-oxidation at a temperature in the range between approximately 850° C. to 1300° C., preferably at approximately 1000° C., around for 72 minutes so as to form a thermal-oxidized silicon layer with a relatively thin thickness of approximately 60 nm, which is employed for the gate- insulator layer (gate oxidized layer) 2 of the pixel switching TFT 30 and the peripheral circuit TFT 80. The transistor devices in the present exemplary embodiment are manufactured with the manufacturing process as shown in FIGS. 5A–5E, and accordingly, the patterning process can be performed on the substrate 10 with the layer thickness of the semiconductor layer 206 being uniform, thereby enabling patterning to be extremely easily performed, and also enabling occurrence of over-etching of the insulator layer 12 to be prevented.

With the gate-oxidation process, in the event of employing the substrate wherein the side-face passivation layer 25 and 85 are provided on the side face of the semiconductor layers 1a and 80a, the gate-insulator layer 2 is formed only on the top face of the semiconductor layers 1a and 80a. Accordingly, with the first semiconductor layer 1a, the top face thereof is electrically insulated by the gate-insulator layer 2, and the side face thereof is electrically insulated by the side-face passivation layer 25. Also, the second semiconductor layer 80a is insulated in the same manner as with the first semiconductor layer 1a.

Also, in the event of employing the SOI substrate to which the side-face passivation layers 25 and 85 have been provided, the side-face passivation layers 25 and 85 are formed with generally the same height as the layer thickness of the semiconductor layers 1a and 80a prior to gate-oxidation, and accordingly, the semiconductor layers 1a and 80a become relatively thin by gate-oxidation, and thus, the heights of the side-face passivation layers 25 and 85 are greater than the layer thickness of the semiconductor layers 1a and 80a following the gate-oxidation. Accordingly, in the event of employing the SOI substrate including the side-face passivation layer 25 and 85, the semiconductor layers 1a and 80a at the outer edge are protected by the gate-insulator layer 2 and the side- face passivation layers 25 and 85, and accordingly, the distance between the gate electrode and the semiconductor layer does not partially become thin (in particular, around the outer edge of the semiconductor layer), thereby enabling transistor devices with excellent reliability to be formed wherein the parasitic MOS phenomenon does not readily occur.

Next, as shown in FIG. 9C, a resist film 301 is formed at a position corresponding to the semiconductor layer 1a of the pixel switching TFT 30, dopant 302 belonging to Group III elements such as B (boron) or the like is doped into the second semiconductor layer 80a on the second semiconductor region, and subsequently, the resist film 301 is removed.

Subsequently, as shown in FIG. 9D, a resist film 303 is formed at a position corresponding to the second semiconductor layer 80a, dopant 304 belonging to Group III elements such as B (boron) or the like is doped into the first semiconductor layer 1a, and subsequently, the resist film 303 is removed.

Next, a polysilicon layer is deposited by the decompression CVD method or the like, and subsequently, phosphorus (P) is thermal-diffused into the polysilicon layer so that the polysilicon layer is made electroconductive, and scanning lines 3a and the gate electrodes 83 are formed in a predetermined pattern by the photolithography process using a resist mask, etching process, and the like, as shown in FIG. 10A. While the scanning lines 3a and the first semiconductor layer 1a are insulated one from another by the gate insulator layer 2, in the event that the side-face passivation layer 25 is provided, these are insulated one from another on the top face of the first semiconductor layer 1a by the gate insulator layer 2, and are insulated one from another on the side face of the first semiconductor layer 1a by the side-face passivation layer 25. Also, while the gate electrodes 83 and the second semiconductor layer 80a are insulated one from another by the gate insulator layer 2, in the event that the side-face passivation layer 85 is provided on the side face of the second semiconductor layer 80a, these are insulated one from another on the top face of the second semiconductor layer 80a by the gate insulator layer 2, and are insulated one from another on the side face of the second semiconductor layer 80a by the side-face passivation layer 85.

Next, as shown in FIG. 10B, a resist film 305 is formed at a position corresponding to the first semiconductor layer 1a for formation of an LDD region on the second semiconductor layer 80a. Subsequently, dopant 306, such as P belonging to Group V elements is doped with a low concentration, with the gate electrodes 83 as diffusion masks, so as to form the N-channel low concentration source region 80b and low concentration drain region 80c, and subsequently, the resist film 305 is removed.

Next, as shown in FIG. 10C, a resist film 307 is formed at a position corresponding to the second semiconductor layer 80a for formation of an LDD region on the first semiconductor layer 1a. Subsequently, dopant 308, such as P belonging to the V group elements is doped with a low concentration, with the scanning lines 3a as diffusion masks, so as to form the N-channel low concentration source region 80b and low concentration drain region 1c, and subsequently, the resist film 307 is removed as shown in FIG. 11A.

Next, as shown in FIG. 11B, a resist film 401 with a width greater than that of the scanning line 3a is formed on the scanning line 3a, and also a resist film 309 with a width greater than that of the gate electrode 83 is formed on the gate electrode 83.

Subsequently, dopant 61 such as P belonging to Group V elements is doped with high concentration with the resist films 309 and 401 as masks, so as to form the high concentration source region 1d and high concentration drain region 1e on the first semiconductor layer 1a, and also the high concentration source region 80d and high concentration drain region 80e on the second semiconductor layer 80a.

Subsequently as shown in FIG. 11C, the resist films 309 and 401 are removed, and transistor devices 31 and 81 are formed with different semiconductor layer thickness.

Subsequently, the second intermediate insulator layer 4, the data line 6a, the input signal line 86a and output signal line 86b which are preferably formed on the support substrate 10 with transistor devices 31 and 38 formed thereon with the same material and at the same time as the data line 6a, the third intermediate insulator layer 7, the pixel electrodes 9, the alignment layer, and the like are formed with the conventional method, thereby obtaining the TFT array substrate for the liquid crystal device shown in FIG. 4.

Electronic Apparatus

Now, description will be made regarding an example of an electronic apparatus including a liquid crystal device according to the above-described embodiments.

Figure 13:
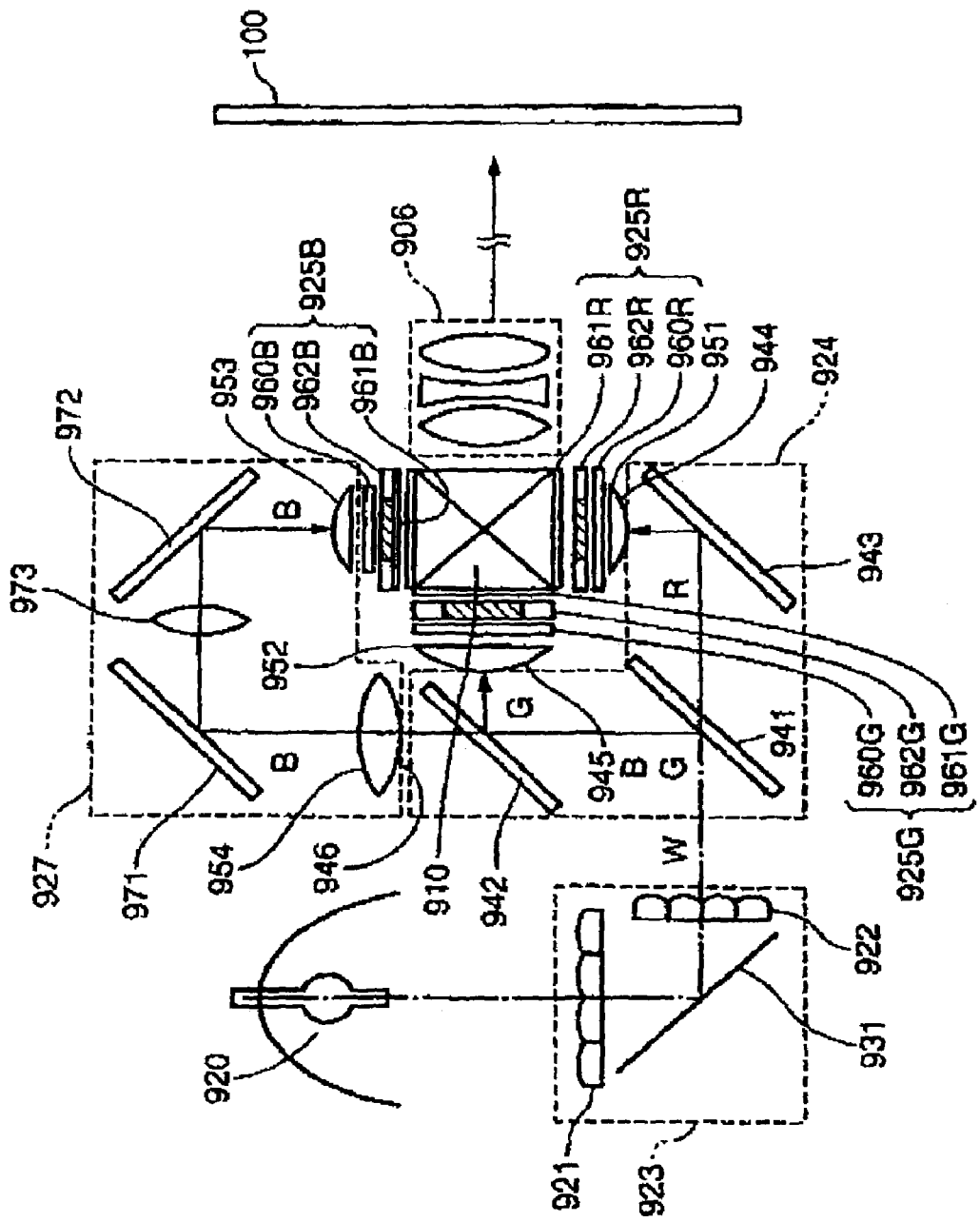
FIG. 13 is a schematic diagram of a projection-type display device according to the present invention.

FIG. 13 is a schematic configuration diagram which illustrates an example of a projection-type display device according to the present invention. FIG. 13 is a schematic configuration diagram which illustrates an optical system of the projection-type display device wherein the three liquid crystal devices described above are employed as liquid crystal devices 962R, 962G, and 962B, for RGB. The optical system of the projection-type display device in the present example employs a light source 920 and a uniform-luminance optical system 923. The projection-type display device includes a color-separation optical system 924 serving as color-separation means to separate a light flux W cast from the uniform-luminance optical system 923 into red (R), green (G), and blue (B), three light valves 925R, 925G, and 925B serving as modulation means for modulating each light flux R, G, and B, a color-synthesizing prism 910 serving as color-synthesizing means to re-synthesize color light fluxes following modulation, and a projection lens unit 906 serving as projection means to project the synthesized light flux onto a projection face 100 in a expanded manner. Furthermore, the projection-type display device includes a light guide system 927 for guiding the blue light flux to the corresponding light valve 925B.

The uniform-luminance optical system 923 includes two lens plates 921 and 922, and a reflection mirror 931, and the two lens plates 921 and 922 are disposed at a position wherein the two lens plates are orthogonal one to another, with the reflection mirror 931 introduced therebetween. The two lens plates 921 and 922 of the uniform-luminance optical system 923 include multiple rectangular lenses disposed in a matrix pattern, respectively. The light flux cast from the light source device 920 is divided into multiple partial light fluxes by the rectangular lenses of the first lens plate 921. Subsequently, these partial light fluxes are interposed around the three light valves 925R, 925G, and 925B, by the rectangular lenses of the second lens plate 922.

The color-separation optical system 924 includes a blue-green-reflection dichroic mirror 941, a green reflection dichroic mirror 942, and a reflection mirror 943. The blue light flux B and green light flux G contained in the light flux W, are reflected by the blue-green reflection dichroic mirror 941 in the orthogonal direction, and cast onto the green- reflection dichroic mirror 942. Red light flux R passes through the mirror 941, is reflected by the reflection mirror 943 situated behind in the orthogonal direction, and is output from an output unit 944 for the red light flux R to the color-synthesizing prism 910.

Subsequently, only the green light flux G of the blue and green fluxes B and G reflected by the blue-green reflection dichroic mirror 941 is reflected by the green- reflection dichroic mirror 942 in the orthogonal direction, and is output from an output unit 945 for the green light flux G to the color-synthesizing optical system. The blue light flux B, which has passed through the green-reflection dichroic mirror 942, is output from an output unit 946 for the blue light flux B to the light guide system 927. With the present example, the color-separation optical system 924 is arranged with the distances between the output units thereof 944, 945, and 946, and output unit for the light flux W of the uniform luminance optical device being generally the same.

Condenser lenses 951 and 952 are disposed on the output sides of the output units 944 and 945 for red and green light fluxes R and G of the color separation optical system 924.

Accordingly, the red and green light fluxes R and G output from each output nit are cast onto the condenser lenses 951 and 952 so as to be made parallel.

The red and green light fluxes R and G, which have been made parallel, are input to the light valves 925R and 925G so as to be modulated for addition of image information corresponding to each color light. For example, these liquid crystal devices are switching-controlled according to the image information by a driving device which is not shown in the drawings, thereby enabling modulation of each color light passing through to be performed. On the other hand, the blue light flux B is guided to the corresponding light valve 925B via a light guide system 927, and is subjected to modulation according to the image information the same as described above. Note that the light valves 925R, 925G, and 925B in the present example includes input polarizing means 960R, 960G, and 960B, output polarizing means 961R, 961G, and 961B, and liquid crystal devices 962R, 962G, and 962B disposed therebetween, respectively.

The light guide system 927 includes a condenser lens 954 disposed on the output side of the output unit 946 for the blue light flux B, an input side reflection mirror 971, an output side reflection mirror 972, an intermediate lens 973 disposed between these reflection mirrors, and a condenser lens 953 disposed in front of the light valve 925B. The blue light flux B cast from the condenser lens 946 is guided to the liquid crystal device 962B via the light guide system 927 for modulation. With the length of light path for each color light flux, i.e., the distance between the output unit for the light flux W and each liquid crystal device 962R, 962G, or 962B, the length of light path for blue light flux B is the greatest, and accordingly, the loss of the light amount for the blue light flux becomes the greatest. However, the loss of the light amount can be suppressed by introducing the light guide system 927.

Light fluxes R, G, and B subjected to modulation via light valves 925R, 925G, and 925B, respectively, are input to the color-synthesizing prism 910 for synthesizing. Subsequently, the light synthesized by the color-synthesizing prism 910, is cast on the surface of the projection face 100, at a predetermined position via the projection lens unit 906 in an enlarged manner.

The projection-type display device as described above includes the liquid crystal devices 962R, 962G, and 962B according to the exemplary embodiment in the invention, thereby enabling a projection-type display device with excellent display quality to be provided.

FIG. 14A is a perspective view which illustrates an example of a cellular phone. In FIG. 14A, reference numeral 1000 denotes a main unit of the cellular phone, and reference numeral 1001 denotes a liquid crystal display unit employing the above-described liquid crystal display device.

FIG. 14B is a perspective view which illustrates an example of a watch-type electronic apparatus. In FIG. 14B, reference numeral 1100 denotes a main unit of a watch, and reference numeral 1101 denotes a liquid crystal display unit employing the above- described liquid crystal display device.

FIG. 14C is a perspective view which illustrates an example of a mobile information processing device such as a word processor, personal computer, or the like. In FIG. 14C, reference numeral 1200 denotes an information processing device, reference numeral 1202 denotes an input unit such as a keyboard or the like, reference numeral 1204 is a main unit of the information processing device, and reference numeral 1206 denotes a liquid crystal display unit employing the above-described liquid crystal display device.

The electronic apparatuses shown in FIGS. 14A through 14C, include the liquid crystal display unit employing the liquid crystal device according to the above- described embodiments, thereby enabling an electronic apparatus including a display unit with excellent reliability to be realized.

Note that the scope of the technique according to the present invention is not intended to be restricted to the above-described embodiments, but rather various modification may be made without departing from the spirit and scope of the invention. For example, while description has been made regarding the liquid crystal device by way of an example, the present invention is not intended to be restricted to the liquid crystal device, but rather, various types of electro-optical devices wherein the display state can be controlled for each of multiple pixels, such as an electroluminescence device, an inorganic electroluminescence device, a plasma display device, an electrophoretic display device, a field emission display device, LED (light emitting diode) display device, or the like.

Semiconductor Device

Figure 15:
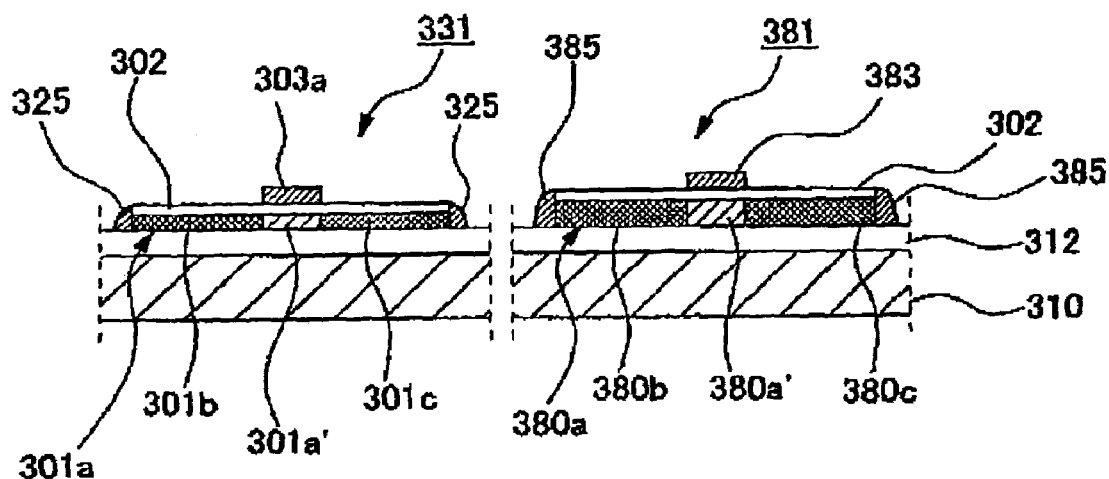
FIG. 15 is a partial cross-sectional configuration diagram illustrating an embodiment of a semiconductor device according to the present invention.

Now, an exemplary embodiment with regard to a semiconductor device according to the present invention will be described below with reference to the drawings. FIG. 15 is a partial cross-sectional configuration diagram which illustrates an exemplary embodiment of a semiconductor device according to the present invention. The semiconductor device shown in the drawing is an arrangement wherein complete-depletion- type TFTs and partial-depletion-type TFTs are formed on an SOI substrate having a semiconductor layers 301$a$ and 380$a$ made up of a mono-crystalline silicon layer formed on a silicon substrate 310 with a insulator layer 312 introduced therebetween, and the complete- depletion-type TFT is shown on the left side in FIG. 15, and the partial-depletion-type TFT is shown on the right side in FIG. 15.

Note that while description will be made regarding the TFTs 330 and 380 with regard to the present exemplary embodiment, the device which can be mounted to the semiconductor device according to the present invention is not restricted to a transistor.

First of all, the complete-depletion-type TFT 330 shown on the left side in FIG. 15 includes a gate terminal 303$a$, a channel region 301$a'$ in a semiconductor layer 301$a$ in which a channel is formed by the electric field applied from the gate terminal 303$a$, a gate insulator layer (gate oxidized layer) 302 to insulate the gate terminal 303$a$ from the semiconductor layer 1$a$, and a source region 301$b$ and a drain region 301$c$ in the semiconductor layer 1$a$. The gate terminal 303$a$ is formed facing the channel regions.

Note that with practical semiconductor device, an opening is made on the gate insulator layer 302 so as to form a source terminal on the source region 301$b$ of the semiconductor layer 301$a$. The gate insulator layer 302 is partially opened so as to formed a drain terminal on the drain region 301$c$. The source region 301$b$ and the drain region 301$c$ are formed by impurity ions being doped into the semiconductor layer 301$a$ with a predetermined concentration.

Moreover, a side-face passivation layer 325, made up of an oxidation- resistant material such as silicon-nitride or the like, may be formed on the side face of the semiconductor layer 301$a$. The complete-depletion-type TFT 330 is insulated from the gate terminal 303$a$ by the gate insulator layer 302 on the top face of the semiconductor layer 301$a$ and the side-face passivation layer 325 surrounding the circumference of the semiconductor layer 301$a$. Due to such a configuration being employed, the semiconductor layer 301 is insulated from the gate terminal 303a by the gate insulator layer 302, which has been formed with a uniform layer thickness, on the top face of the semiconductor layer 301a. The circumferential portion of the semiconductor layer 301a is insulated from the gate terminal 303a by the side-face passivation layer 325. Accordingly, with the configuration of the present exemplary embodiment, occurrence of the parasitic MOS phenomenon due to the distance between the gate terminal 303a and the semiconductor layer 301a (i.e., the layer thickness of the gate insulator layer 302) partially being made thin around the outer edge of the semiconductor layer 301a, can be effectively suppressed, thereby enabling TFTs with excellent current characteristics and excellent reliability to be configured.

On the other hand, the partial-depletion-type TFT 380 shown on the right side in FIG. 15 includes a gate terminal 383, a channel region 380a' in a semiconductor layer 380a in which a channel is formed by the electric field applied from the gate terminal 383, a gate insulator layer 302 to insulate the gate terminal 383 from the semiconductor layer 380a, a source region 380b and 380c in the semiconductor layer 380a, and a side-face passivation layer 385, pressed into contact against the circumferential wall of the semiconductor layer 380, in the same way as the complete-depletion-type TFT 330 shown on the left side in FIG. 15. Also, with the partial-depletion-type TFT 380, the source region 380b and the drain region 380c are formed by doping impurity ions into the semiconductor layer 380a with a predetermined concentration, in the same way as the complete-depletion-type TFT 330.

Also, the side-face passivation layer 385, made up of an oxidation-resistant material such as silicon-nitride, may be formed on the side face of the semiconductor layer 380a of the above-described partial-depletion-type TFT 380. For example, the partial- depletion-type TFT 380 according to the present exemplary embodiment is insulated from the gate terminal 383 by the gate insulator layer 302 on the top face of the semiconductor layer 380a and the side-face passivation layer 385. Due to such a configuration being employed, the top face of the semiconductor layer 80a is insulated from the gate terminal 383 by the gate insulator layer 302 formed with a uniform layer thickness, and the outer edge and the side face of the semiconductor layer 380a are insulated from the gate terminal 383 by the side-face passivation layer 385. Accordingly, with the configuration of the present exemplary embodiment, occurrence of the parasitic MOS phenomenon, due to the distance between the gate terminal 383 and the semiconductor layer 380a (the layer thickness of the gate insulator layer 302) partially being made thin, can be effectively suppressed, thereby enabling TFTs with excellent current characteristics and excellent reliability to be configured.

As shown in FIG. 15, the semiconductor layer 301a making up the complete- depletion-type TFT 330 is formed with a layer thickness less than that of the semiconductor layer 380a making up the partial-depletion-type TFT 380. Due to a configuration such as this being employed, with the complete-depletion-type TFT 330, off-leakage current can be reduced. On the other hand, the partial-depletion-type TFT 380 is formed with the layer thickness of the semiconductor layer 380a being great, thereby enabling high-speed operations.

While the layer thickness of the semiconductor layer 301a making up the above-described complete-depletion-type TFT 330 is not specifically restricted, a uniform layer thickness is employed in the range between 30 nm and 100 nm, preferably between 30 nm and 80 mm, and more preferably between 40 nm and 60 nm.

In the event that the layer thickness of the semiconductor layer 301a is equal to or less than 100 nm, the depletion layer controlled by the gate terminal can be expanded more than the semiconductor layer 301a regardless of impurity concentration of the channel portion, thereby enabling the TFT 330 to be easily formed into a complete-depletion-type TFT. Moreover, in the event that the layer thickness of the semiconductor layer 301a is equal to or less than 100 nm, preferably is equal to or less than 80 nm, and more preferably is equal to or less than 60 nm, an off-leakage current can be suppressed to an extremely small value, which is effective.

Also, in the event that the layer thickness of the semiconductor layer 301a is equal to or greater than 30 nm, and is preferably equal to or greater than 40 nm, irregularities of transistor characteristics such as a threshold voltage and the like, due to the layer thickness of the channel region 301a', can be reduced. Also, the contact resistance does not increase.

Also, while the layer thickness of the semiconductor layer 380a making up the above-described partial-depletion-type TFT 380 is not specifically restricted, a uniform layer thickness is preferably employed in the range between 100 nm and 600 nm, and more preferably between 150 nm and 400 nm.

In the event that the layer thickness of the semiconductor layer 301a is equal to or greater than 100 nm, and is more preferably equal to or greater than 150 nm, sufficient voltage withstanding capabilities are obtained, and also the sheet resistance is suppressed to a sufficient small value, and thus sufficient current driving capabilities can be obtained for the semiconductor integrated circuit, thereby enabling the integrated circuit which can be driven with high-speed to be configured.

On the other hand, in the event that the layer thickness of the semiconductor layer 380a is equal to or greater than 600 nm, difficulties in manufacturing might occur, such as irregularities of the layer thickness in the etching process, wherein the semiconductor layer 301a making up the complete-depletion-type TFT 330 is formed, which is undesirable.

Note that, with the present exemplary embodiment, while description has been made regarding the semiconductor device wherein the complete-depletion-type TFTs 330 and the partial-depletion-type TFTs 380 are formed on the same substrate by way of an example, the scope of the techniques of the present invention is not intended to be restricted to the configuration. For example, with regard to the semiconductor device, an arrangement may be made wherein only the complete-depletion-type TFTs are employed, an arrangement may be made wherein only the partial-depletion-type TFTs are employed, or an arrangement may be made wherein semiconductor devices other than TFT devices are formed on the semiconductor layer.

Manufacturing Method for Semiconductor Device

With the manufacturing methods for the semiconductor device according to the present invention, the manufacturing method for the electro-optical devices according to the above-described first through fourth exemplary embodiments may be applied to an SOI substrate wherein a mono-crystalline silicon layer is formed on a silicon substrate with an insulator layer introduced therebetween. Specifically, the manufacturing method involves a silicon substrate being employed for the support substrate 10 of the SOI substrate shown in FIGS. 5A–5E through FIGS. 8A–8E, and each process is performed. With the manufacturing method, semiconductor layers with different layer thickness can be easily formed on the SOI substrate, and moreover, the semiconductor layer is subjected to patterning prior to thinning processing for semiconductor layer, thereby enabling overetching for the insulator layer to be prevented, and further enabling the two-dimensional pattern of the semiconductor layer to be controlled with good precision, and thus, the same advantages as with the manufacturing methods for the electro-optical devices according to the exemplary embodiments can be obtained.

Electronic Apparatus Employing the Semiconductor Device

Figure 16:
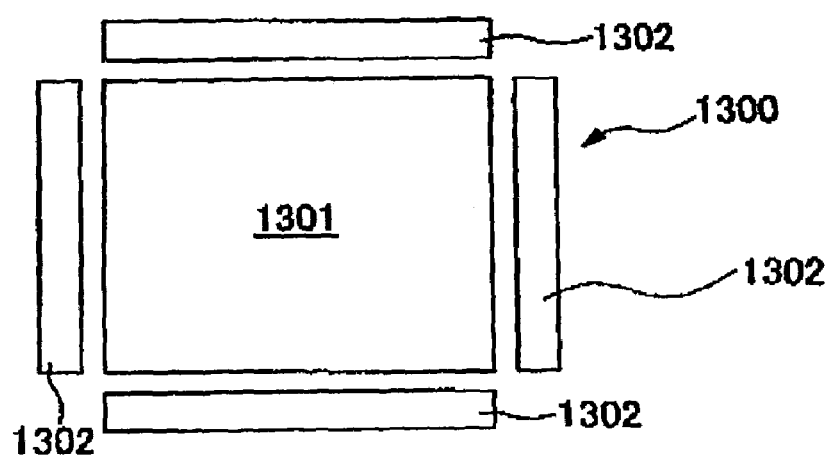
FIG. 16 is a plan configuration diagram illustrating an example of the electronic apparatus according to the present invention.

Now, taking a semiconductor integrated circuit including an internal circuit and a peripheral driving circuit to drive the internal circuit as an example of an electronic apparatus employing the semiconductor device according to the above-described embodiments, description will be made with reference to FIG. 16. FIG. 16 is a schematic configuration diagram which illustrates a semiconductor integrated circuit 1300 according to the present exemplary embodiment. The semiconductor integrated circuit 1300 includes an internal circuit 1301 on which memory and the like is formed, and a peripheral driving circuit 1302 such as an input/output buffer provided so as to surround the internal circuit. With the semiconductor integrated circuit according to the present exemplary embodiment, complete-depletion-type devices are formed on the internal circuit 1301, and partial-depletion-type devices are formed on the peripheral driving circuit 1302. Thus, the off-leakage current is reduced in the internal circuit 1301, and low-voltage operations can be performed in the peripheral driving circuit 1302 due to the voltage withstanding capabilities, and the reduction of the threshold.

As described above in detail, the manufacturing method for the electro-optical device according to the present invention includes a patterning process for patterning the semiconductor layer according to a predetermined two-dimensional shape and dividing the semiconductor layer into a plurality of semiconductor regions, and a thin-layer formation process for thin-layer formation of one or more regions of the semiconductor regions formed by the patterning process into a predetermined semiconductor layer thickness, and accordingly, the semiconductor is patterned with a uniform layer thickness on the substrate, so the etching depth is uniform on the substrate, and thus over-etching of the insulator layer, which has been a problem with conventional manufacturing methods, does not occur. Also, the semiconductor region which is to be subjected to layer-thinning in the layer-thinning process has been divided from other semiconductor regions beforehand, and the pattern of the semiconductor layer on each region can be readily controlled, thereby enabling the semiconductor layer to be formed with a more accurate pattern. Moreover, with the manufacturing method for the electro-optical device according to the present invention, the mono-crystalline silicon layer has been separated beforehand prior to oxidation of the surface of the mono-crystalline silicon layer, and accordingly, the area of the mono-crystalline silicon layer can be reduced, and thus, occurrence of defects such as slips or the like in the mono-crystalline silicon layer due to the difference in thermal expansion of the mono-crystalline silicon layer and thermal-oxidized layer can be easily prevented. Accordingly, with the manufacturing method according to the present invention, electro-optical devices on which semiconductor devices with excellent reliability are formed can be manufactured with a high yield.

Moreover, with the present invention, problems with regard to conventional techniques, which have been occurred in semiconductor devices employing an SOI substrate, can be solved, and also the shape of the semiconductor layer can be easily controlled, thereby enabling a manufacturing method for easily manufacturing semiconductor devices with excellent reliability to be provided.

Furthermore, with the present invention, electro-optical devices with excellent reliability, and projection-type display devices and electronic apparatuses including the electro-optical devices, and semiconductor devices with excellent reliability, and electronic devices including the semiconductor devices, can be provided.

What is claimed is:

1. A method for manufacturing an electro-optical device including a substrate and a semiconductor layer formed on said substrate with an insulating film introduced therebetween, wherein said semiconductor layer is divided into two or more semiconductor regions with different layer thickness, said method comprising: patterning said semiconductor layer according to a predetermined flat shape and dividing said semiconductor layer into the two or more semiconductor regions; forming a side-face passivation layer containing oxidation-resistant material on a partial side face portion of at least one semiconductor region where thin-layer formation is to be performed; and forming a thin-layer of semiconductor layers having substantially coplanar surface to the side-face passivation layer by reducing a thickness of the at least one semiconductor region after forming the side-face passivation layer, to a predetermined semiconductor layer thickness, comprising: forming an oxidized layer on a top face of said semiconductor region by oxidizing the top face of the semiconductor region; and removing the oxidized layer to perform thin-layer formation of said semiconductor region.

2. The method for manufacturing an electro-optical device according to claim 1, forming the side-face passivation layer further comprising:
    forming the side-face passivation layer also on semiconductor regions other than the at least one semiconductor region.

3. The method for manufacturing an electro-optical device according to claim 1, said side-face passivation layer being removed at the same time as said oxidation layer.

4. The method for manufacturing an electro-optical device according to claim 1, said side-face passivation layer being a layered structure, comprising:
    an oxidized film formed of an oxide of a material making up said semiconductor layer, and an oxidation-resistant film made up of oxidation-resistant material formed on said oxidized film.

5. The method for manufacturing an electro-optical device according to claim 1, the height of said side-face passivation layer in the direction of the thickness of the semiconductor layer being formed to be approximately the same height as the layer thickness of the semiconductor layer to be subjected to thin-layer formation following thin-layer formation.

6. A method for manufacturing a semiconductor device, including a substrate, a semiconductor layer formed on said substrate with an insulating film introduced therebetween, said semiconductor layer being divided into two or more semiconductor regions with different layer thickness, said method comprising: patterning said semiconductor layer according to a predetermined two-dimensional shape and dividing said semiconductor layer into a plurality of semiconductor regions; and forming thin-layer semiconductor layers in one or more regions of said semiconductor regions formed by said patterning process into a predetermined semiconductor layer thickness in said thin-layer formation process, a thickness of the thin-layer semiconductor layers in the one or more regions being thinner than a thickness of the semiconductor layer in other semiconductor regions, a side-face passivation layer containing oxidation-resistant material being formed on a partial side face portion of the one or more regions, following which an oxidized layer is formed, after forming the side-face passivation layer, on a top face of the one or more regions by oxidizing the top face of the one or more regions, and subsequently said oxidized layer is removed, thereby performing thin-layer formation of said semiconductor layer layers having substantially coplanar surface to the side-face passivation layer in the one or more regions.

7. The method for manufacturing a semiconductor device according to claim 6, side-face passivation layer being formed also on semiconductor regions other than the one or more semiconductor regions.

8. The method for manufacturing a semiconductor device according to claim 6, wherein said side-face passivation layer being removed at the same time as said oxidation layer.

9. The method for manufacturing a semiconductor device according to claim 6, said side-face passivation layer being a layered structure, comprising:

an oxidized film formed of an oxide of a material making up said semiconductor layer; and an oxidation-resistant film made up of oxidation-resistant material formed on said oxidized film.

10. The method for manufacturing a semiconductor device according to claim 6, the height of said side-face passivation layer in the direction of the thickness of the semiconductor layer being formed to be approximately the same height as the layer thickness of the semiconductor layer to be subjected to thin-layer formation following thin-layer formation.

11. The method for manufacturing a semiconductor device according to claim 9, the material making up said semiconductor layer being mono- crystalline silicone, and the oxidized film formed of an oxide of a material making up said semiconductor layer being a silicon oxide film or a silicone oxynitride film.

* * * * *